US010910247B2

(12) United States Patent
Honsho et al.

(10) Patent No.: US 10,910,247 B2
(45) Date of Patent: Feb. 2, 2021

(54) SUBSTRATE CONTAINER, LOAD PORT APPARATUS, AND SUBSTRATE TREATING APPARATUS

(71) Applicant: SCREEN Holdings Co., Ltd., Kyoto (JP)

(72) Inventors: Kazuhiro Honsho, Kyoto (JP); Mitsukazu Takahashi, Kyoto (JP); Akito Hatano, Kyoto (JP); Koji Hashimoto, Kyoto (JP)

(73) Assignee: SCREEN Holdings Co., Ltd.

( * ) Notice: Subject to any disclaimer, the term of this patent is extended or adjusted under 35 U.S.C. 154(b) by 736 days.

(21) Appl. No.: 15/508,688

(22) PCT Filed: Jul. 28, 2015

(86) PCT No.: PCT/JP2015/071408
§ 371 (c)(1),
(2) Date: Mar. 3, 2017

(87) PCT Pub. No.: WO2016/035480
PCT Pub. Date: Mar. 10, 2016

(65) Prior Publication Data
US 2017/0263479 A1 Sep. 14, 2017

(30) Foreign Application Priority Data
Sep. 5, 2014 (JP) .............................. 2014-181104

(51) Int. Cl.
*H01L 21/673* (2006.01)
*H01L 21/677* (2006.01)
(Continued)

(52) U.S. Cl.
CPC .... *H01L 21/67309* (2013.01); *B65D 43/0202* (2013.01); *B65D 85/30* (2013.01);
(Continued)

(58) Field of Classification Search
CPC ......... H01L 21/67383; H01L 21/67369; H01L 21/67373; H01L 21/67309; H01L 21/67772
See application file for complete search history.

(56) References Cited

U.S. PATENT DOCUMENTS 6,267,245 B1 * 7/2001 Bores ................ H01L 21/67369
206/454
6,951,284 B2 * 10/2005 Cheesman ........ H01L 21/67369
206/454
(Continued)

FOREIGN PATENT DOCUMENTS

| JP | 2005-005525 A | 1/2005 | |
| JP | 2005005525 A * | 1/2005 | ....... H01L 21/67369 |
| JP | 2007-227941 A | 9/2007 | |

OTHER PUBLICATIONS

International Search Report dated Oct. 20, 2015 in corresponding PCT International Application No. PCT/JP2015/071408.
(Continued)

*Primary Examiner* — Allan D Stevens
(74) *Attorney, Agent, or Firm* — Ostrolenk Faber LLP

(57) ABSTRACT

A substrate container including a casing, a rack, a casing holder, a casing lifting mechanism, a lid, and a lid holder. When holding of substrates with the rack shifts to holding of the substrates with the casing holder and the lid holder, the casing lifting mechanism moves the casing holder upward, whereby the casing holder moves the substrates upward. When the holding of the substrates with the casing holder and the lid holder shifts to the holding of the substrates with the rack, the casing lifting mechanism moves the casing holder downward, whereby the casing holder moves the substrates downward.

5 Claims, 19 Drawing Sheets

(51) Int. Cl.
  *B65D 43/02* (2006.01)
  *B65D 85/30* (2006.01)
(52) U.S. Cl.
  CPC .. *H01L 21/67369* (2013.01); *H01L 21/67373* (2013.01); *H01L 21/67383* (2013.01); *H01L 21/67393* (2013.01); *H01L 21/67772* (2013.01)

(56) References Cited

U.S. PATENT DOCUMENTS

| | | | | |
|---|---|---|---|---|
| 7,316,315 | B2* | 1/2008 | Matsutori | H01L 21/67369 |
| | | | | 206/454 |
| 7,344,031 | B2* | 3/2008 | Hasegawa | H01L 21/67369 |
| | | | | 206/454 |
| 2014/0197068 | A1* | 7/2014 | Cho | H01L 21/67369 |
| | | | | 206/711 |

OTHER PUBLICATIONS

Written Opinion dated Oct. 20, 2015 in corresponding PCT International Application No. PCT/JP2015/071408.

\* cited by examiner

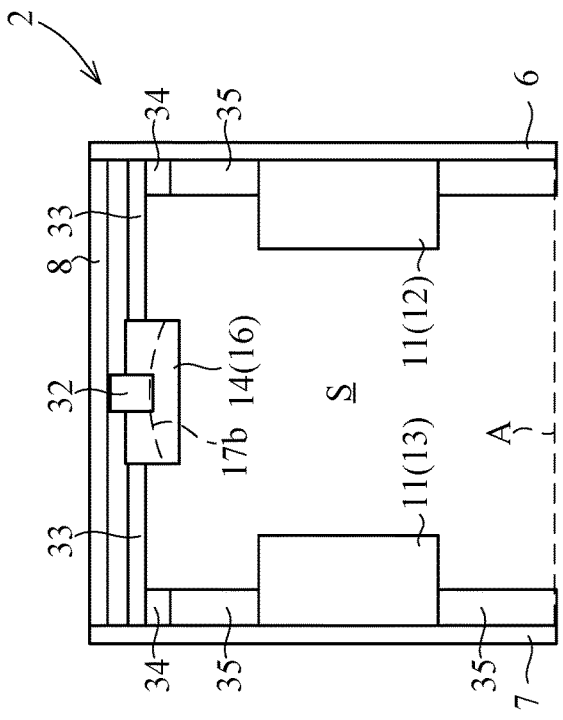
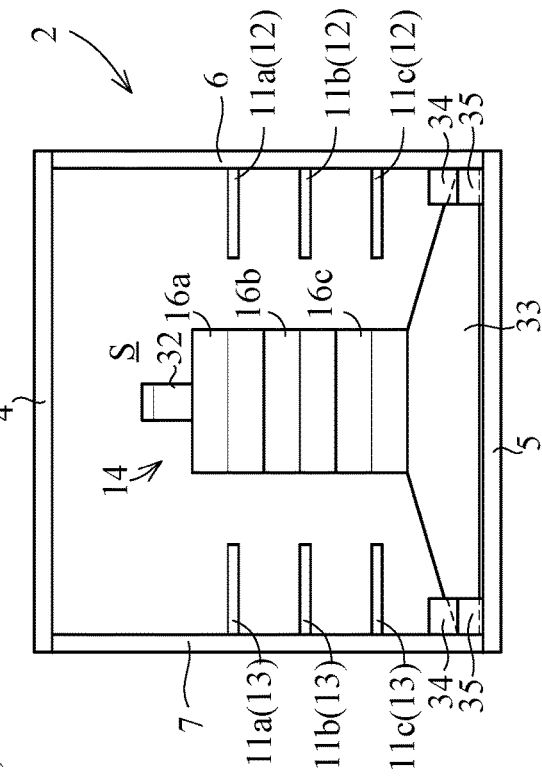
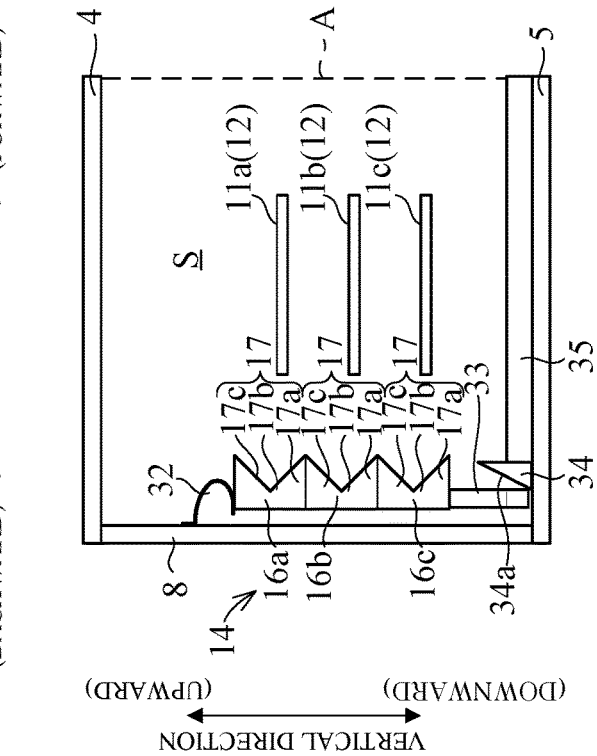

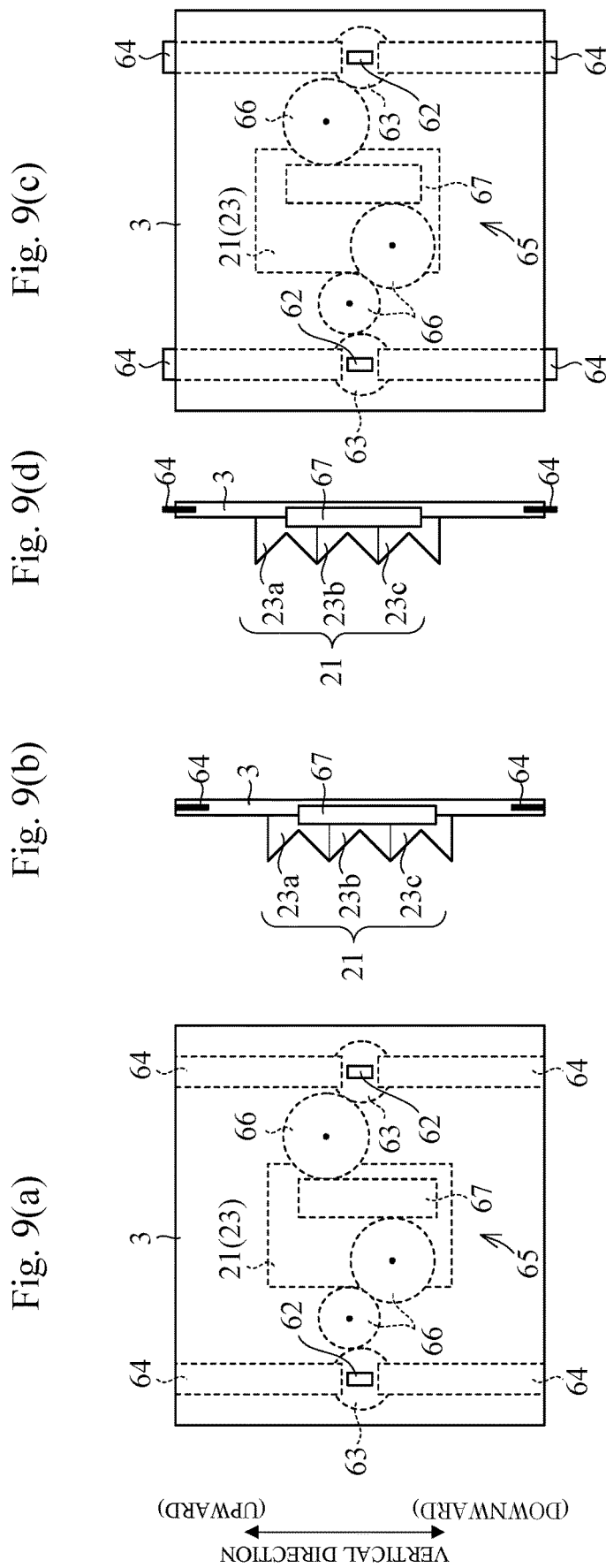

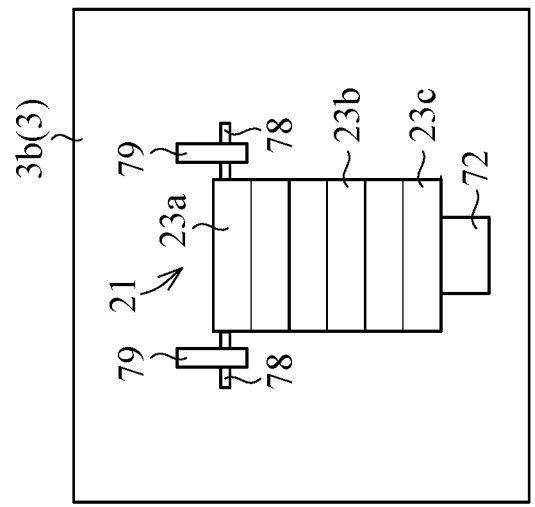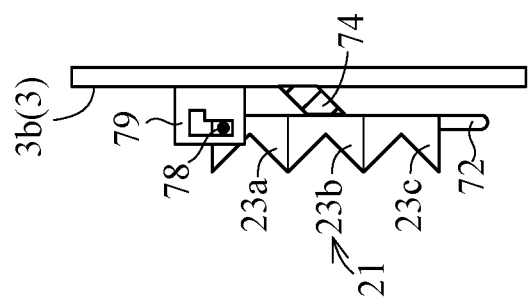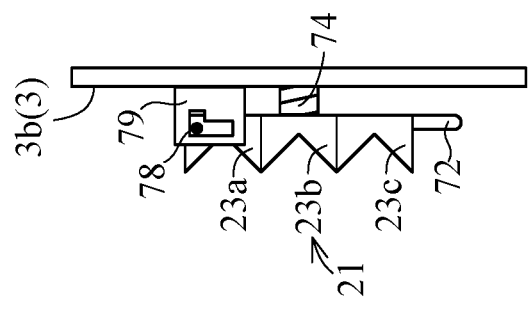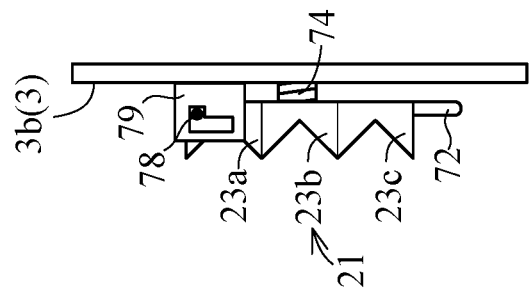

SUBSTRATE CONTAINER, LOAD PORT APPARATUS, AND SUBSTRATE TREATING APPARATUS

CROSS-REFERENCE TO RELATED APPLICATIONS

The present application is a 35 U.S.C. §§ 371 national phase conversion of PCT/JP2015/071408, filed Jul. 28, 2015, which claims priority to Japanese Patent Application No. 2014-181104, filed Sep. 5, 2014, the contents of both of which are incorporated herein by reference. The PCT International Application was published in the Japanese language.

TECHNICAL FIELD

The present invention relates to a substrate container that accommodates a semiconductor wafer, a glass substrate for a photomask, a glass substrate for a liquid crystal display, an optical disk substrate, and the like (hereinafter, simply referred to as a "substrate") as well as a load port apparatus and a substrate treating apparatus applicable thereto.

BACKGROUND ART

A currently-used substrate container holds a substrate in two holding modes. Such a substrate container includes a casing, a lid, a rack, and a cushion. The casing accommodates a plurality of substrates. The lid is attached/detached to/from the casing. The rack and the cushion are disposed inside the casing. The rack supports the substrates while contacting undersurfaces of the substrates. The cushion holds the substrates while the substrates are away from the rack. As noted above, the substrate container allows holding of the substrates in the mode in which the rack holds the substrates and in the mode in which the cushion holds the substrates.

When the mode shifts from substrate holding with the rack to substrate holding with the cushion, the substrates slide along a surface of the cushion to move upward. Moreover, the mode shifts from the substrate holding with the cushion to the substrate holding with the rack, the substrates slide along the surface of the cushion to move downward.

Patent Literature 1: Japanese Unexamined Patent Publication No. 2007-227941A

SUMMARY OF INVENTION

Technical Problem

However, Inventors have found that the example of the currently-used apparatus with such a construction has the following drawback. Specifically, since the substrates and the cushion slide relative to each other, particles are likely to be generated between the cushion and the substrates, leading to difficulty in keeping the clean atmosphere within the casing.

The present invention has been made regarding the state of the art noted above, and its one object is to provide a substrate container, a load port apparatus, and a substrate treating apparatus that achieve inhibited generation of particles.

Solution to Problem

The present invention is constituted as stated below to achieve the above object. One aspect of the present invention provides a substrate container. The substrate container includes a casing with an opening on its front face that accommodates substrates therein, a rack inside the casing that holds the substrates while contacting undersurfaces of the substrates in a substantially horizontal attitude, a casing holder within the casing that holds ends of the substrates, a casing lifting mechanism that moves the casing holder upward/downward relative to the casing, a lid that is attached/detached to/from the casing and opens/closes the opening, and a lid holder that is attached to a rear face of the lid and holds ends of the substrates. The casing holder and the lid holder nip the ends of the substrates while the rack does not contact the undersurfaces of the substrates. When substrate holding with the rack shifts to substrate holding with the casing holder and the lid holder, the casing lifting mechanism moves the casing holder upward, whereby the casing holder moves the substrates upward. When the substrate holding with the casing holder and the lid holder shifts to the substrate holding with the rack, the casing lifting mechanism moves the casing holder downward, whereby the casing holder moves the substrates downward.

[Operation and Effect] The substrate container achieves substrate holding in two modes. A first substrate holding mode is to hold the substrates with the rack. Specifically, in the first holding mode, the rack supports the substrates while contacting the undersurfaces of the substrates. A second holding mode is to hold the substrates with the casing holder and the lid holder. Specifically, in the second holding mode, the casing holder and the lid holder hold the substrates while the rack does not contact the undersurfaces of the substrates.

When the first holding mode shifts to the second holding mode, the casing lifting mechanism moves the casing holder upward. This causes the casing holder to move the substrates upward while the casing holder holds the substrates. In other words, the casing holder moves substrates W upward without sliding with the substrates. Consequently, inhibited particle generation is obtainable between the substrates and the casing holder.

When the second holding mode shifts to the first holding mode, the casing lifting mechanism moves the casing holder downward. This causes the casing holder to move the substrates downward while the casing holder holds the substrates. In other words, the casing holder moves the substrates W downward without sliding with the substrates. Consequently, inhibited particle generation is obtainable between the substrates and the casing holder.

In the aspect of the present invention, it is preferred that the casing lifting mechanism moves the casing holder upward/downward in response to attachment/detachment of the lid to/from the casing. The casing lifting mechanism moves the casing holder upward/downward with use of movement of the lid attached/detached to/from the casing. Accordingly, the casing lifting mechanism needs no power source for upward/downward movement of the casing holder. Moreover, the substrate holding mode is switchable at a timing of attaching/detaching the lid to/from the casing.

In the aspect of the present invention, it is preferred that the casing lifting mechanism includes a movable base that moves within the casing when the lid is attached/detached to/from the casing, and that movement of the movable base causes the casing holder to move upward/downward. Here, the attachment/detachment of the lid to/from the casing causes movement of the movable base, and the movement of the movable base causes upward/downward movement of the casing holder. As noted above, the movable base achieves suitable response of the movement of the lid to the upward/downward movement of the casing holder.

In the aspect of the present invention, it is preferred that the casing lifting mechanism includes a casing elastic member that elastically deforms in accordance with movement of the casing holder substantially horizontally and applies a restoring force to the casing holder. In other words, it is preferred that the casing lifting mechanism includes a casing elastic member that elastically deforms by movement of the casing holder away from the lid holder and presses the casing holder toward the lid holder. The casing lifting mechanism includes the casing elastic member, whereby a gap between the casing holder and the lid holder is able to follow an external dimension of the substrates with ease. This allows the casing holder and the lid holder to nip the substrates suitably.

It is preferred that the aspect of the present invention further includes a casing guiding mechanism that guides the casing holder. Accordingly, the casing holder is movable suitably in accordance with on the casing guiding mechanism.

Another aspect of the present invention provides a substrate container. The substrate container includes a casing with an opening on its front face that accommodates substrates therein, a rack inside the casing that holds the substrates while contacting undersurfaces of the substrates in a substantially horizontal attitude, a casing holder within the casing that holds ends of the substrates, a casing guiding mechanism that guides the casing holder upward/downward relative to the casing, a lid that is attached/detached to/from the casing and opens/closes the opening, and a lid holder that is attached to a rear face of the lid and holds ends of the substrates. The casing holder and the lid holder nip the ends of the substrates while the rack does not contact the undersurfaces of the substrates. When substrate holding with the rack shifts to substrate holding with the casing holder and the lid holder, the casing holder moves upward in accordance with the casing guiding mechanism, whereby the casing holder moves the substrates upward. When the substrate holding with the casing holder and the lid holder shifts to the substrate holding with the rack, the casing holder moves downward in accordance with the casing guiding mechanism, whereby the casing holder moves the substrates downward.

Operation and Effect

The substrate container achieves the substrate holding in first and second modes. When the mode shifts to the second holding mode, the casing holder moves upward in accordance with the casing guiding mechanism. This causes the casing holder to move the substrates upward while the casing holder holds the substrates. When the mode shifts to the first holding mode, the casing holder moves downward in accordance with the casing guiding mechanism. This causes the casing holder to move the substrates downward while the casing holder holds the substrates. Consequently, the substrates and the casing holder do not slide relative to each other when the mode shifts to any of the first and second holding modes. This obtains inhibited particle generation between the substrates and the casing holder.

In the aspect of the present invention, it is preferred that the casing holder moves upward/downward in response to attachment/detachment of the lid to/from the casing. The casing holder moves upward/downward with use of movement of the lid attached/detached to/from the casing. Accordingly, the substrate container needs no power source for upward/downward movement of the casing holder.

Moreover, the substrate holding mode is switchable at a timing of attaching/detaching the lid to/from the casing.

It is preferred that the aspect of the present invention further includes a casing elastic member that elastically deforms in accordance with movement of the casing holder substantially horizontally and applies a restoring force to the casing holder. In other words, it is preferred that the substrate container includes a casing elastic member that elastically deforms by movement of the casing holder away from the lid holder and presses the casing holder toward the lid holder. The substrate container includes the casing elastic member, whereby a gap between the casing holder and the lid holder is able to follow an external dimension of the substrates with ease. This allows the casing holder and the lid holder to nip the substrates suitably.

The following is preferred in the aspect of the present invention. That is, the lid holder is movable upward/downward relative to the lid. The substrate container includes a lid lifting mechanism that moves the lid holder upward/downward relative to the lid. When substrate holding with the rack shifts to substrate holding with the casing holder and the lid holder, the lid lifting mechanism moves the lid holder upward, whereby the lid holder moves the substrates upward. When the substrate holding with the casing holder and the lid holder shifts to the substrate holding with the rack, the lid lifting mechanism moves the lid holder downward, whereby the casing holder moves the substrates downward. Here, upon shifting to any of the first and second holding modes, the substrates and the lid holder do not slide relative to each other. This obtains inhibited particle generation between the substrates and the lid holder.

The following is preferred in the aspect of the present invention. That is, the lid holder is movable upward/downward relative to the lid. The substrate container includes a lid guiding mechanism that guides the lid holder upward/downward relative to the lid. When substrate holding with the rack shifts to substrate holding with the casing holder and the lid holder, the lid holder moves upward in accordance with the lid guiding mechanism, whereby the lid holder moves the substrates upward. When the substrate holding with the casing holder and the lid holder shifts to the substrate holding with the rack, the lid holder moves downward in accordance with the lid guiding mechanism, whereby the lid holder moves the substrates downward. Here, upon shifting to any of the first and second holding modes, the substrates and the lid holder do not slide relative to each other. This obtains inhibited particle generation between the substrates and the lid holder.

Another aspect of the present invention provides a substrate container. The substrate container includes a casing with an opening on its front face that accommodates substrates therein, a rack inside the casing that holds the substrates while contacting undersurfaces of the substrates in a substantially horizontal attitude, a casing holder within the casing that holds ends of the substrate, a lid that is attached/detached to/from the casing and opens/closes the opening, a lid holder that is attached to a rear face of the lid movably upward/downward relative to the lid and holds ends of the substrates, and a lid lifting mechanism that moves the lid holder upward/downward relative to the lid. The casing holder and the lid holder nip the ends of the substrates while the rack does not contact the undersurfaces of the substrates. When substrate holding with the rack shifts to substrate holding with the casing holder and the lid holder, the lid lifting mechanism moves the lid holder upward, whereby the lid holder moves the substrates upward. When the substrate holding with the casing holder and the lid holder shifts to the substrate holding with the rack, the lid lifting mechanism moves the lid holder downward, whereby the casing holder moves the substrates downward.

[Operation and Effect] The substrate container allows substrate holding in first and second holding modes. When the mode shifts to second holding mode, the lid lifting mechanism moves the lid holder upward. This causes the lid holder to move the substrates upward without sliding with the substrates. When the mode shifts to the first holding mode, the lid lifting mechanism moves the lid holder downward. This causes the lid holder to move the substrates downward without sliding with the substrates. Accordingly, upon shifting to any of the first and second holding modes, inhibited particle generation is obtainable between the substrates and the lid holder.

In the aspect of the present invention, it is preferred that the lid lifting mechanism moves the lid holder upward/downward relative to the casing in response to locking/unlocking of the lid to/from the casing. The lid lifting mechanism moves the lid holder upward/downward with use of locking and unlocking of the lid. Accordingly, the lid lifting mechanism needs no power source for moving the lid holder upward/downward. In addition, the substrate holding mode is switchable at a timing of locking/unlocking the lid to/from the casing.

It is preferred that the aspect of the present invention further includes a locking mechanism that locks the lid to the casing, and that the lid lifting mechanism is interlocked to the locking mechanism and moves the lid holder upward/downward in response to operation of the locking mechanism. The lid lifting mechanism allows the lid holder to move upward/downward with use of operation of the locking mechanism. This simplifies a construction of the lid lifting mechanism.

In the aspect of the present invention, it is preferred that the lid lifting mechanism moves the lid holder upward/downward in response to attachment/detachment of the lid to/from the casing. The lid lifting mechanism moves the lid holder upward/downward with use of the attachment/detachment of the lid to/from the casing. Accordingly, the lid lifting mechanism needs no power source for moving the lid holder upward/downward. Moreover, the substrate holding mode is switchable at a timing of attaching/detaching the lid to/from the casing.

In the aspect of the present invention, it is preferred that the lid lifting mechanism includes a fixed base fixedly disposed within the casing, and that the fixed base includes a slope on which the lid and the lid holder slide to move the lid holder upward/downward when the lid is attached/detached to/from the casing. Such attachment/detachment of the lid to/from the casing causes the lid holder to slide on the slope of the fixed base (i.e., causes the lid holder to move upward/downward). As noted above, the fixed base achieves suitable response of the movement of the lid to upward/downward movement of the lid holder.

In the aspect of the present invention, it is preferred that the lid lifting mechanism includes a lid elastic member that deforms elastically in accordance with approach of the lid holder to the lid and applies a restoring force to the lid holder. In other words, it is preferred that the lid lifting mechanism includes a lid elastic member that elastically deforms by moving the lid holder away from the casing holder and presses the lid holder toward the casing holder. The lid lifting mechanism includes the lid elastic member, whereby a gap between the casing holder and the lid holder is able to follow an external dimension of the substrates with ease. This allows the casing holder and the lid holder to nip the substrates suitably.

It is preferred that the aspect of the present invention further includes a lid guiding mechanism that guides the lid holder. The lid holder achieves suitable movement in accordance with the lid guiding mechanism.

One aspect of the present invention provides a substrate container. The substrate container includes a casing with an opening on its front face that accommodates substrates therein, a rack inside the casing that holds the substrates while contacting undersurfaces of the substrates in a substantially horizontal attitude, a casing holder within the casing that holds ends of the substrate, a lid that is attached/detached to/from the casing and opens/closes the opening, and a lid holder that is attached to a rear face of the lid and holds ends of the substrates, and a lid guiding mechanism that guides the lid holder upward/downward relative to the lid. The casing holder and the lid holder nip the end faces of the substrates while the rack does not contact undersurfaces of the substrates. When substrate holding with the rack shifts to substrate holding with the casing holder and the lid holder, the lid holder moves upward in accordance with the lid guiding mechanism, whereby the lid holder moves the substrates upward. When the substrate holding with the casing holder and the lid holder shifts to the substrate holding with the rack, the lid holder moves downward in accordance with the lid guiding mechanism, whereby the lid holder moves the substrates downward.

[Operation and Effect] The substrate container allows substrate holding in first and second modes. When the mode shifts to the second holding mode, the lid holder moves upward in accordance with the lid guiding mechanism. This causes the lid holder to lift the substrates upward without sliding with the substrates. When the second holding mode shifts to the first holding mode, the lid holder moves downward in accordance with the lid guiding mechanism. This causes the lid holder to move the substrates downward without sliding with the substrates. Accordingly, upon shifting to any of the first and second holding modes, inhibited particle generation is obtainable between the substrates and the lid holder.

In the aspect of the present invention, it is preferred that the lid holder moves upward/downward in response to attachment/detachment of the lid to/from the casing. The lid holder moves upward/downward with use of attachment/detachment of the lid to/from the casing. Accordingly, the substrate container needs no power source for moving the lid holder upward/downward. Moreover, the substrate holding mode is switchable at a timing of attaching/detaching the lid to/from the casing.

It is preferred that the aspect of the present invention further includes a lid elastic member that elastically deforms in accordance with approach of the lid holder to the lid and applies a restoring force to the lid holder. In other words, it is preferred that the substrate container includes a lid elastic member that elastically deforms by movement of the lid holder away from the casing holder and presses the lid holder toward the casing holder. The substrate container includes the lid elastic member, whereby a gap between the casing holder and the lid holder is able to follow an external dimension of the substrates with ease. This allows the casing holder and the lid holder to nip the substrates suitably.

Another aspect of the present invention provides a load port apparatus including a mount table on which the substrate container according to the above aspects of the present invention is placeable, and a lid open/close mechanism that opens/closes the lid of the substrate container placed on the mount table.

[Operation and Effect] The load port apparatus according to the aspect of the present invention achieves suitable placement of the substrate container mentioned above.

Another aspect of the present invention provides a substrate treating apparatus including a mount table on which the substrate container according to the above aspects of the present invention is placeable, a lid open/close mechanism that opens/closes the lid of the substrate container placed on the mount table, a treating unit that performs treatment to substrates, and a transport mechanism that transports the substrates from the substrate container placed on the mount table to the treating unit.

[Operation and Effect] The substrate treating apparatus according to the aspect of the present invention allows treatment to the substrates accommodated in the substrate container mentioned above.

Note that, in the aspects mentioned above, the direction where the casing holder moves upward/downward is not limited to the vertical direction. The direction where the lid holder moves upward/downward is not also limited to the vertical direction. For instance, when the casing lifting mechanism moves the casing holder upward/downward, the casing holder may move in a horizontal direction, or otherwise is applicable. In other words, the direction where the casing lifting mechanism moves the casing holder upward/downward may include a horizontal component besides a vertical component, or otherwise is applicable. Likewise, the direction where the casing guiding mechanism guides the casing holder, the direction where the lid lifting mechanism moves the lid holder upward/downward, and the lid guiding mechanism guides the lid holder may each include a horizontal component besides a vertical component, or otherwise is applicable.

Moreover, when the casing holder starts lifting the substrate upward, the substrates may contact the rack, or the substrates may have already been separated from the rack. In other words, at a timing when the casing lifting mechanism starts moving the casing holder upward, the substrates may be held in the first holding mode, or otherwise is applicable. Likewise, when the lid holder starts lifting the substrates upward, the substrates may contact the rack, or the substrates may have already been separated from the rack.

Advantageous Effects of Invention

With the substrate container, the load port apparatus, and the substrate treating apparatus according to the aspects of the present invention, the substrates do not slide with at least either the casing holder or the lid holder upon shifting to the first holding mode. In addition, the substrates do not slide with at least either the casing holder or the lid holder upon shifting to the second holding mode. Accordingly, inhibited particle generation is obtainable. This suppresses particles adhesion to the substrates, and the atmosphere within the substrate container is kept clean.

BRIEF DESCRIPTION OF DRAWINGS

FIG. 2(a) is a plan view illustrating an interior of a casing with the top plate 4 not shown, FIG. 2(b) is a side view illustrating the interior of the casing with the left wall 7 not shown, and FIG. 2(c) is a front view illustrating the interior of the casing.

FIGS. 9(a) to 9(d) illustrate front views and side views of a lid according to Embodiment 3.

FIG. 11(a) is a back view of a lid according to Embodiment 4 of the present invention, and FIGS. 11(b) to 11(d) are each a side view of the lid according to Embodiment 4.

DESCRIPTION OF EMBODIMENTS

The following describes five embodiments of the present invention. Embodiment 1 exemplarily describes a casing lifting mechanism of the present invention. Embodiment 2 exemplarily describes a casing guiding mechanism of the present invention. Embodiment 3 exemplarily describes a lid lifting mechanism of the present invention. Embodiment 4 exemplarily describes a lid lifting mechanism and a lid guiding mechanism of the present invention. Embodiment 5 exemplarily describes a lid guiding mechanism of the present invention.

Embodiment 1

1. Configuration of Substrate Container

Figure 1A:
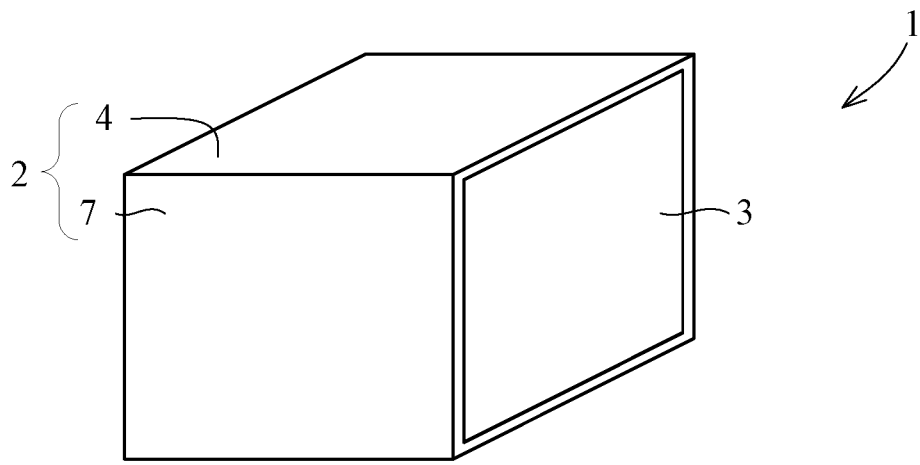
FIG. 1(a) is a perspective view illustrating an external appearance of a substrate container having a lid attached to a casing.
Figure 1B:
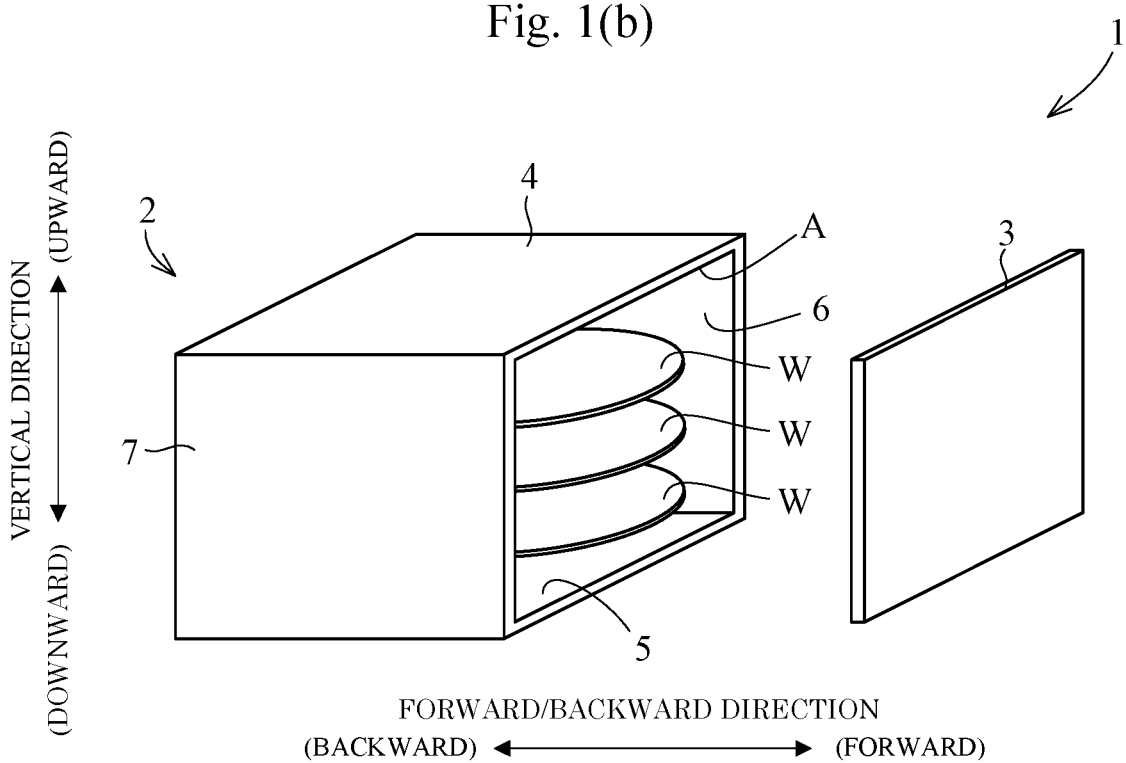
FIG. 1(b) is a perspective view illustrating an external appearance of a substrate container having the lid not attached to the casing.

Reference is made to FIGS. 1(a) and 1(b). A substrate container 1 has an outer shape of a substantially rectangular solid. The substrate container 1 allows accommodation of a plurality of substrates W. Here, examples of the "substrate W" include a semiconductor wafer, a glass substrate for a photomask, a glass substrate for a liquid crystal display, a substrate for plasma display, an optical disk substrate, a magnetic disc substrate, and an optical magnetic disc substrate.

The substrate container 1 includes a casing 2 and a lid 3. The lid 3 is attached to a front face of the casing 2. As illustrated in FIG. 1(b), the casing 2 includes an opening A at the front face thereof. The lid 3 opens/closes the opening A. The opening A is a virtual plane in a substantially vertical direction. When the lid 3 is attached/detached to/from the casing 2, the lid 3 moves in a forward/backward direction that is substantially orthogonal relative to the opening A while the lid 3 faces to the opening A. Here, the forward/backward direction is substantially horizontal. The casing 2 includes therein a space S (see FIG. 2) for accommodating the substrates W. The substrate container 1 is able to accommodate at least one of the substrates W. The substrate container 1 typically accommodates twenty-five substrates W. Hereinafter, the substrate container 1 that is able to accommodate a maximum of three substrates W is to be described as one example for convenience.

Reference is made to FIGS. 2(a) to 2(c) in addition to FIGS. 1(a) and 1(b). The casing 2 includes a top plate 4, a bottom plate 5, a right wall 6, a left wall 7, and a rear wall 8. The elements 4 to 8 define the space S. FIG. 2(a) abbreviates the top plate 4 and the bottom plate 5 for convenience. FIG. 2(b) abbreviates the right wall 6 and the left wall 7. FIG. 2(c) abbreviates the rear wall 8.

In the specification, of the forward/backward directions, a direction that is from the rear wall 8 to the opening A is referred to as a "forward direction", and a direction opposite to the forward direction is referred to as a "backward direction".

The casing 2 includes therein racks 11a, 11b, and 11c. The racks 11a, 11b, and 11c are disposed in a vertical direction to be one above the other. The racks 11a, 11b, and 11c each support one substrate W placed thereon. The racks 11a, 11b, 11c each support the substrate W in a substantially horizontal attitude from a lower side thereof. The racks 11a, 11b, and 11c each contact an undersurface of the substrate W. In the present specification, the "undersurface of the substrate W" conceptually includes a lower periphery of the substrate W. The substrates W on the racks 11a, 11b, 11c, respectively, are disposed in the vertical direction to be one above the other. Hereinafter, the racks 11a, 11b, and 11c are simply referred to as a "rack 11" when they are not particularly distinguished. As is to be mentioned later, a holding arm 47a is disposed on the exterior of the substrate container 1 for transporting the substrate W to and from the rack 11. When transporting the substrate W to the rack 11, the holding arm 47a enters a position above the rack 11 and slightly moves downward, thereby placing the substrate W on the rack 11. When transporting the substrate W from the rack 11, the holding arm 47a enters a position below the rack 11 and slightly moves upward, thereby holding the substrate W on the rack 11 (see FIGS. 4(a) and 4(b)). Accordingly, a clearance is provided above and below the rack 11 through which the holding arm 47a is able to enter safely (for instance, the holding arm 47a is able to enter with no collision against the substrate W and the rack 11). Moreover, the rack 11 is disposed at a preset gap in the vertical direction so as for the holding arm 47a to enter safely.

In the present embodiment, the rack 11 includes a right rack 12 and a left rack 13. The right rack 12 is separated from the left rack 13. The right rack 12 protrudes from the right wall 6, whereas the left rack 13 protrudes from the left wall 7.

The casing 2 includes therein a casing holder block 14. The casing holder block 14 has casing holders 16a, 16b, and 16c formed therein. The casing holders 16a, 16b, and 16c are disposed in the vertical direction to be one above the other. The casing holders 16a, 16b, and 16c each hold the end of the substrate W. More specifically, the casing holders 16a, 16b, and 16c each hold a rear end of the substrate W. Here, the "rear end of the substrate W" corresponds to a part of the end of the substrate W adjacent to the rear wall 8. Moreover, a part of the substrate W within the casing 2 that is adjacent to the opening A is appropriately referred to as a "front part of the substrate W". Hereinafter, the casing holders 16a, 16b, and 16c are simply referred to as a "casing holder 16" when they are not particularly distinguished.

The casing holder 16 is made of resin, for example. The casing holder 16 has a groove 17 formed therein respectively. As illustrated in FIG. 2(b), the groove 17 is recessed backward. The groove 17 has a substantially "V" shape, for example, in side view.

The groove 17 includes a downward slope 17a, a deepest part 17b, and an upward slope 17c. The downward slope 17a adjoins to a lower part of the deepest part 17b, and the upward slope 17c adjoins to an upper part of the deepest part 17b.

The substrate container 1 further includes a casing lifting mechanism. The casing lifting mechanism is disposed within the casing 2. The casing lifting mechanism moves the casing holder 16 upward/downward relative to the casing 2. The case lifting mechanism includes a spring 32, a casing connecting board 33, movable bases 34, and two rods 35.

The spring 32 holds the casing holder block 14 so as to move upward/downward relative to the lid 3. The spring 32 has a first end connected to the rear wall 8, and a second end connected to the casing holder block 14. The spring 32 deforms in a flection manner in accordance with upward movement of the casing holder 16. The spring 32 presses the casing holder 16 downward while the spring 32 deform in a flection manner.

The casing connecting board 33 is connected to a bottom face of the casing holder block 14 (casing holder 16c). The casing connecting board 33 extends downward from the casing holder block 14. The casing connecting board 33 moves integrally with the casing holder 16.

The movable bases 34 are disposed movably within the casing 2. The movable bases 34 are, for example, slidable on the bottom plate 5. The movable bases 34 each include a slope 34a (see FIG. 2(b)). The slope 34a is inclined relative to the forward/backward direction. In the present embodiment, the slope 34a is inclined so as to be lower in level toward backward. The slope 34a contacts the casing connecting board 33 so as to be slidable thereon.

Rods 35 are movably disposed within the casing 2. The rods 35 are, for example, slidable in the forward/backward direction on the bottom plate 5. The rods 35 each have a rear end for a first end that is connected to the movable base 34. The movable bases 34 move integrally with the rods 35. The rods 35 each have an axis parallel to the forward/backward direction. The rods 35 each have a front end as a second end that extends closely to the opening A. The front ends of the rods 35 are contactable to the lid 3.

The movable bases 34 and the rods 35 move forward/backward in response to upward/downward movement of the casing connecting board 33 and the casing holder 16. The casing holder 16 when the lid 3 does not contact the rods 35 is positioned at the same level as or lower than the casing holder 16 when the lid 3 contacts the rod 35. Here, a position of the casing holder 16 when the lid 3 does not contact rod 35 is referred to as a "lower position". FIG. 2(b) specifically illustrates the casing holder 16 at the lower position. While the casing holder 16 is at the lower position, the deepest parts 17b of the casing holders 16a, 16b, and 16c are set at a substantially equal level to the ends of the substrates W placed on the racks 11a, 11b, and 11c, respectively, substantially horizontally.

Figure 3A:
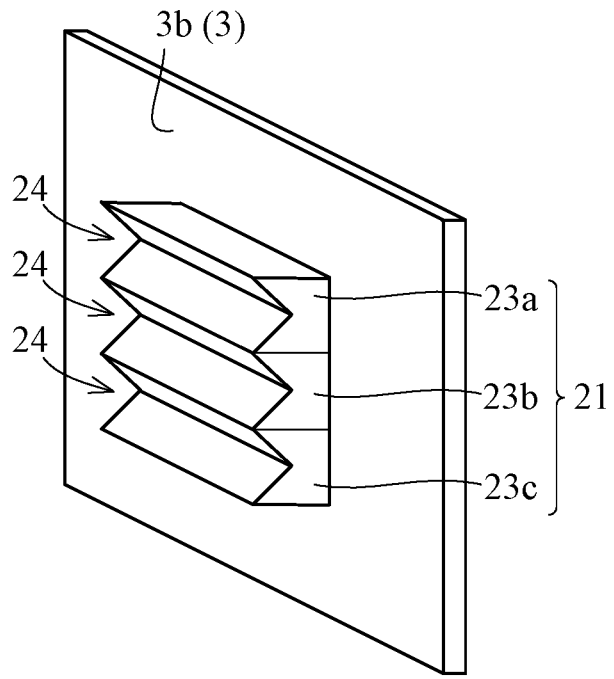
FIG. 3(a) is a perspective view illustrating the lid and a lid holder.
Figure 3B:
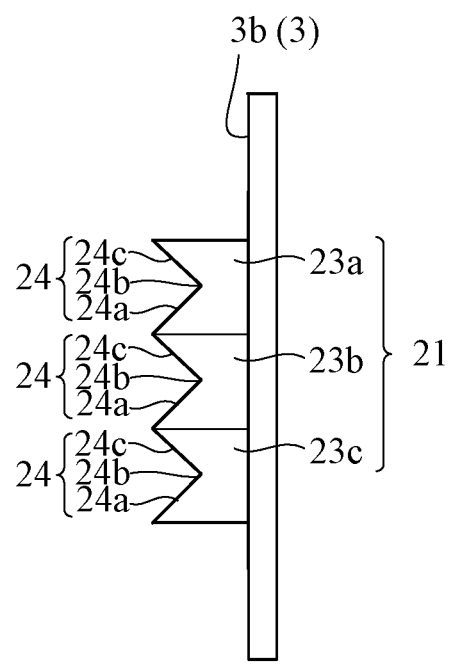
FIG. 3(b) is a side view illustrating the lid and the lid holder.

Reference is made to FIGS. 3(a) and 3(b). A face of the lid 3 contacting the interior of the casing 2 (e.g., the space S) in the condition where the lid 3 is attached to the casing 2 is called a "rear face 3b". A lid holder block 21 is fixed on the rear face 3b. The lid holder block 21 has lid holders 23a, 23b, and 23c formed therein. The lid holders 23a, 23b, and 23c are disposed in the vertical direction to be one above the other. The lid holders 23a, 23b, and 23c each hold the end of the substrate W. More specifically, the lid holders 23a, 23b, and 23c each holds the front ends of the substrates W. As noted above, it is preferred that the ends of the substrates W held with the lid holder 23a, 23b, and 23c each face to the ends of the substrate W held with the casing holder 16 across the center of the substrate W.

The lid holder 23 is made of resin, for example. The lid holder 23 is preferably made of an elastic resin. The lid holder 23 has the same shape as that of the casing holder 16. That is, the lid holder 23 has a groove 24 formed therein respectively. The groove 24 includes a downward slope 24a, a deepest part 24b, and an upward slope 24c.

Figure 5A:
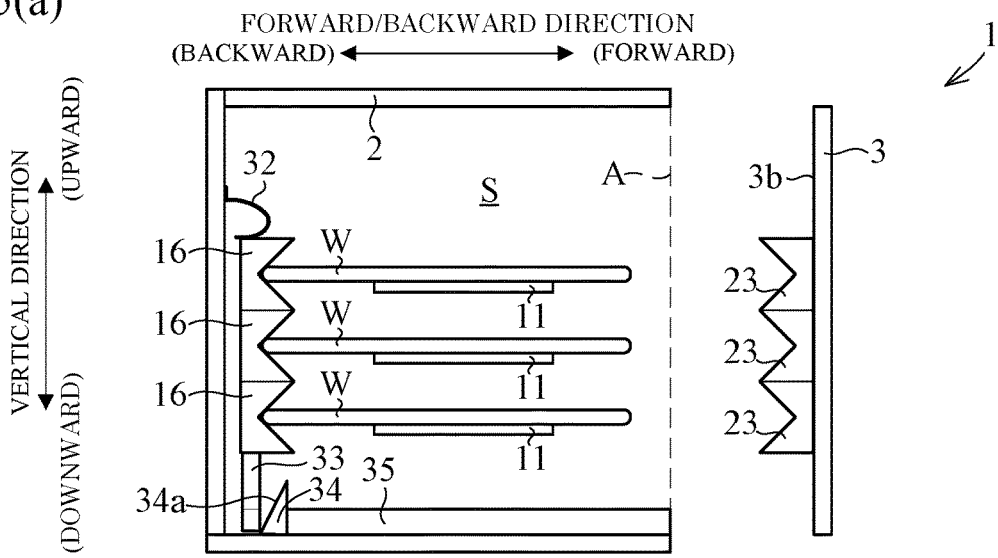
FIGS. 5(a) to 5(c) illustrate the interior of the substrate container with the left wall 7 not shown, when the lid is attached/detached to/from the casing.
Figure 5B:
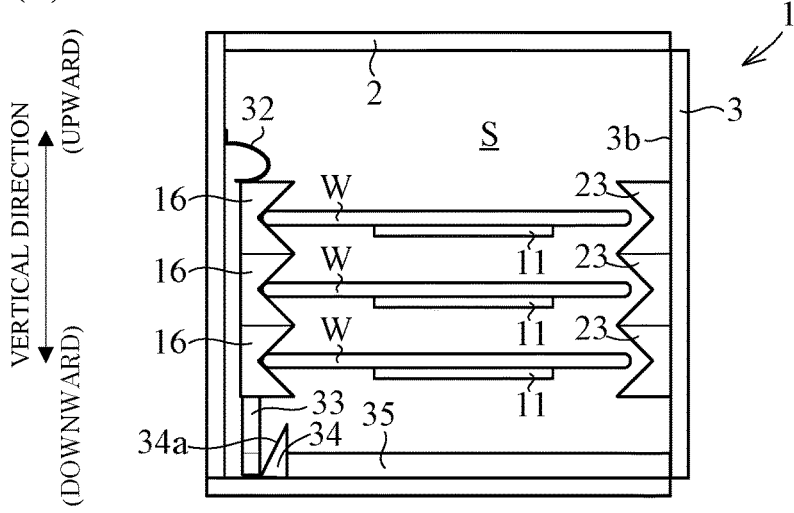
Figure 5C:
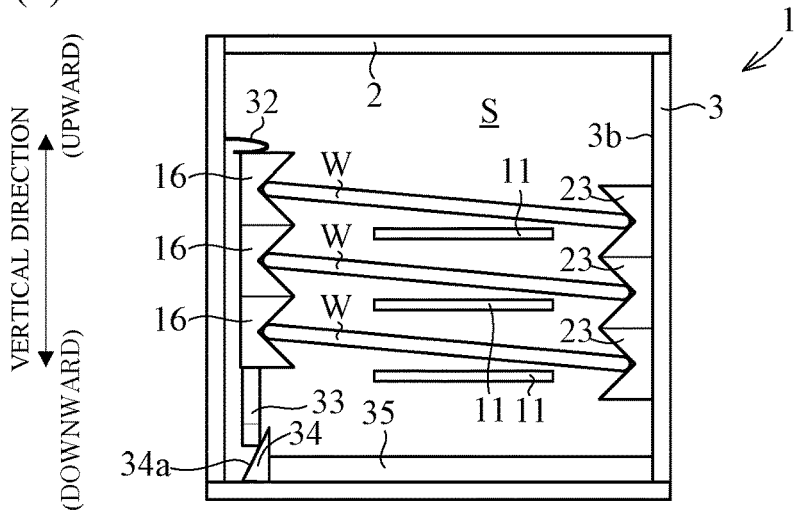

Reference is made to FIGS. 5(a) to 5(c). When the lid 3 faces to the opening A, the deepest parts 24b of the lid holders 23a, 23b, and 23c are each set at a level substantially equal to that of the end of the substrate W placed on the racks 11a, 11b, and 11c, respectively. Hereinafter, the lid holders 23a, 23b, and 23c are simply referred to as a "lid holder 23" when they are not particularly distinguished.

2. Configuration of Load Port Device and Substrate Treating Apparatus

Figure 4A:
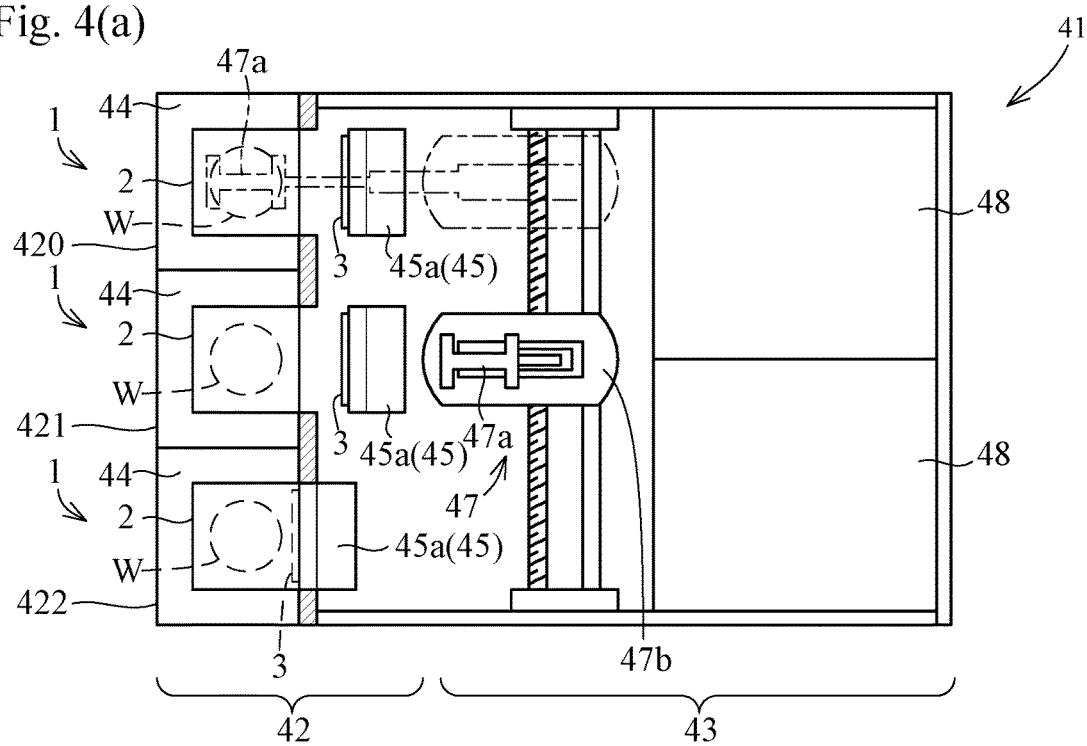
FIG. 4(a) is a plan view of a substrate treating apparatus.
Figure 4B:
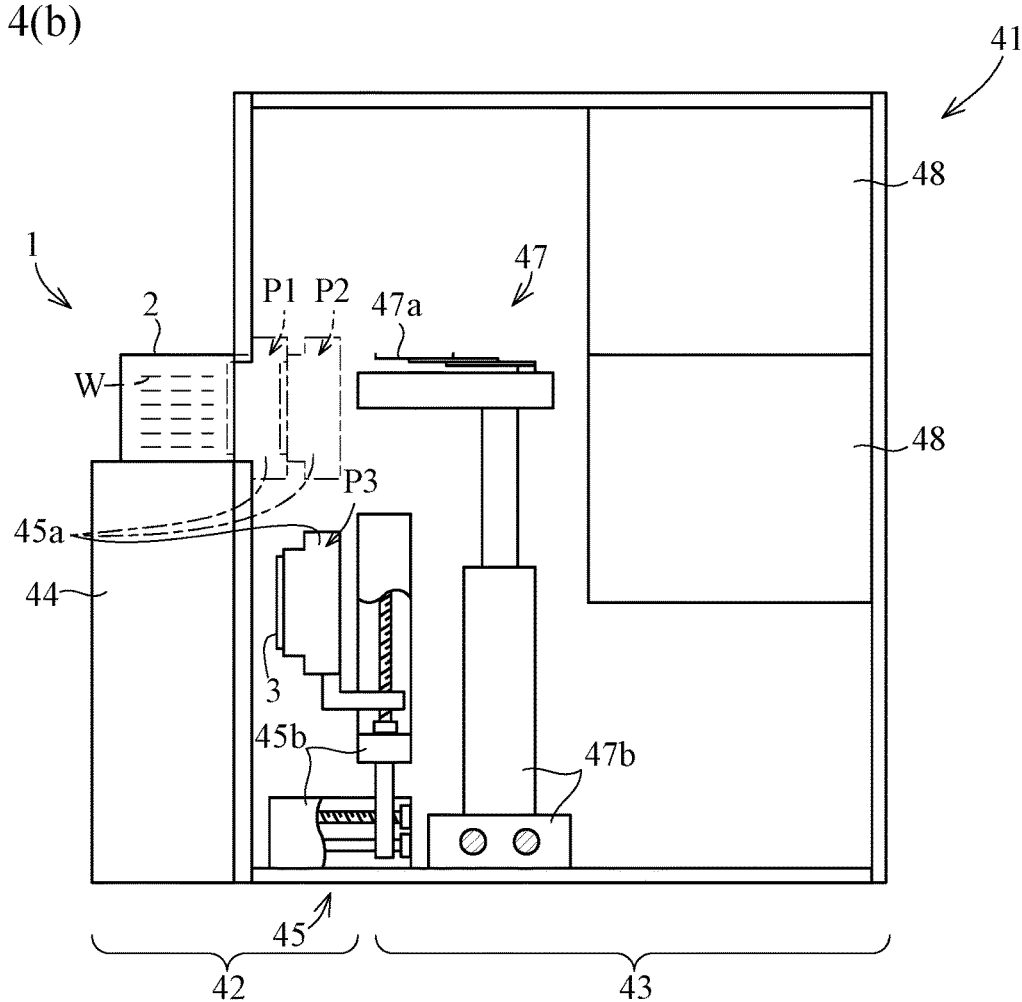
FIG. 4(b) is a side view of the substrate treating apparatus.

The following describes a substrate treating apparatus 41 to which the substrate container 1 is applicable with reference to FIGS. 4(a) and 4(b). The substrate treating apparatus 41 includes a load port section 42 and a treating section 43. The load port section 42 includes a plurality of load port devices 420, 421, and 422. The load port devices 420, 421, and 420 each include a mount table 44 and a lid open/close mechanism 45. The substrate container 1 is placed on the mount table 44. The lid open/close mechanism 45 opens/closes the substrate container 1 placed on the mount table 44. The open/close mechanism 45 includes a shutter 45a and a shutter drive mechanism 45b. The shutter 45a attaches/detaches the lid 3 of the substrate container 1 on the mount table 44, and holds the lid 3 detached from the substrate container 1. When the lid open/close mechanism 45 detaches the lid 3, the shutter drive mechanism 45b moves the shutter 45a to positions P1, P2, and P3 successively (see FIG. 4(b)). When the shutter 45a moves between the position P1 and position P2, the shutter 45a allows the lid 3 to move in the forward/backward direction while the lid 3 faces to the opening A. Here, the load port devices 420, 421, and 422 correspond to the load port apparatus in the present invention.

The treating section 43 includes a transport mechanism 47 and a treating unit 48. The transport mechanism 47 conveys the substrates W. The transport mechanism 47 accesses the substrate container 1 on the mount table 44. The transport mechanism 47 also accesses the treating unit 48. The transport mechanism 47 includes a holding arm 47a that holds the substrates W and a holding arm drive mechanism 47b that moves the holding arm 47a. The treating unit 48 performs treatment, such as cleaning, to the substrates W.

3. Example of Operation

The following describes one example of operation of the substrate container 1 according to Embodiment 1. Hereinunder, a condition is to be firstly described where the lid 3 is detached from the casing 2. Then, an example of operation to attach the lid 3 to the casing 2 and one to detach the lid 3 from the casing 2 are to be described. Finally, an example of operation to transport the substrate W from the substrate container 1 is to be described briefly.

3.1. Condition of Lid 3 Detached from Casing 2

Reference is made to FIGS. 4(a) and 4(b). The substrate container 1 is placed on the mount table 44. The lid 3 is detached from the casing 2, and thus the substrate container 1 is opened. The shutter 45a holds the lid 3 of the substrate container 1 at the position P2 or the position P3, for example. The rods 35 do not contact the lid 3.

The following describes in more detail with reference to FIG. 5(a). FIG. 5(a) illustrates a condition in which the lid 3 is detached from the casing 2. The substrates W are each held in a first holding mode. Here, the "first holding mode" corresponds to holding of the substrates W with the racks 11. More specifically, the first holding mode corresponds to a condition in which the racks 11 support the substrates W while contacting undersurfaces of the substrates W.

The casing holder 16 is disposed at a lower position. The casing holder 16 holds the ends of the substrates W. More specifically, the deepest part 17b of the casing holder 16 contacts the rear part of the end of the substrate W. As noted above, the substrates W may also be held with the casing holder 16 when the substrates W are held in the first holding mode. The casing connecting board 33 contacts the slopes 34a of the movable bases 34.

3.2. Example of Operation when Lid 3 is Attached to Casing 2

Reference is made to FIG. 4(b). The shutter 45a moves from the position P2 to the position P1 while holding the lid 3. This causes the lid 3 to be attached to the casing 2. The following describes a process of attaching the lid 3 by the shutter 45a with reference to FIGS. 5(a) to 5(c). FIG. 5(b) illustrates in midstream of attachment/detachment of the lid 3 to/from the casing 2. FIG. 5(c) illustrates a condition in which the lid 3 is attached to the casing 2.

The lid 3 moves backward from a position in FIG. 5(a) while facing to the opening A. When the lid 3 arrives at a position in FIG. 5(b), the rear face 3b of the lid 3 contacts the front ends of the rods 35.

When the lid 3 is moved further backward from the position in FIG. 5(b), the lid 3 presses the rods 35 and the movable bases 34 backward. The rods 35 and the movable bases 34 start backward movement on the bottom plate 5 of the casing 2. Such backward movement of the movable bases 34 causes the casing connecting board 33 that contacts the slopes 34a to be pressed upward. That is, the casing connecting board 33 moves upward on the slopes 34a. The casing connecting board 33 moves upward, whereby the casing holder 16 moves upward from the lower position against action of the spring 32. The casing holder 16 moves upward, whereby the spring 32 elastically deforms. The casing holder 16 lifts the substrates W upward while holding the rear parts of the ends of the substrates W. This causes the rear ends of the substrates W to move upward and start floating from the rack 11. At this time, the casing holder 16 lifts the substrates W upward while the ends of the substrates W contact the deepest part 17b. That is, the substrates W and the casing holder 16 do not slide each other during upward lifting of the substrates W with the casing holder 16. Consequently, inhibited particle generation is obtainable between the substrates W and the casing holder 16.

Reference is next made to FIG. 5(c). The lid 3 is moved further backward to reach the opening A, whereby the lid 3 is attached to the casing 2. At this time, the lid holder 23 moves backward integrally with the lid 3, whereby the deepest part 24b of the lid holder 23 contacts the front ends of the substrates W. This causes the casing holder 16 and the lid holder 23 to sandwich the ends of the substrates W at the deepest parts 17b and 24b (hereinafter, referred to "nip" appropriately). The lid holder 23 may start contact to the substrates W simultaneously with or before a timing when the lid 3 finishes attachment.

When the lid 3 is attached to the casing 2 in the above manner, the substrates W are held in the second holding mode. Here, the "second holding mode" corresponds to holding of the substrates W with the casing holder 16 and the lid holder 23. More specifically, the second holding mode corresponds to holding of the substrates W with the casing holder 16 and the lid holder 23 while the rack 11 does not contact the undersurfaces of the substrates W. In the present embodiment, the substrates W are inclined forward and downward when the substrates W are held in the second holding mode.

As illustrated in FIG. 5(c), a position of the casing holder 16 when the lid 3 is attached to the casing 2 is referred to as an "upper position". When the substrates W are held in the second holding mode, the casing holder 16 is at the upper position. A difference in level between the upper position (see FIG. 5(a)) and the lower position (see FIG. 5(c)) of the casing holder 16 is smaller than a gap between adjacent racks 11 disposed vertically. Specifically, the gap between the racks 11 is a vertical distance between the racks 11a and 11b and that between the racks 11b and 11c, and hereinafter the gap is referred to as a "pitch of the rack 11" as appropriately.

3.3. Example of Operation of Lid 3 Detached (Separated) from Casing 2

Reference is made to FIG. 4(b). The shutter 45a moves to the position P1 and holds the lid 3 attached to the casing 2. The shutter 45a moves from the position P1 to the position P2 while holding the lid 3. This allows the lid 3 to be detached from the casing 2. The following describes the above in detail.

Reference is made to FIGS. 5(c) and 5(b). When the lid 3 moves forward from the opening A, the casing lifting mechanism moves the casing holder 16 downward. Specifically, forward movement of the lid 3 allows the movable bases 34 and the rods 35 to move forward. Here, the casing connecting board 33 is pressed downward by gravity on the casing holder 16 and the casing connecting board 33 and a restoring force of the spring 32. In addition, the movable bases 34 and the rods 35 are pressed forward by a part of force by which the casing connecting board 33 is pressed downward. Accordingly, the lid 3 moves forward, thereby pushing the movable bases 34 and the rods 35 forward. The movable bases 34 moves forward, whereby the casing holder 16 and the casing connecting board 33 move downward to restore the spring 32.

The casing holder 16 moves downward, thereby moving the substrates W downward while holding the substrates W. In other words, the casing holder 16 moves the substrates W downward without sliding with the substrates W. Upon moving downward to the lower position, the casing holder 16 places the substrates W on the rack 11. This causes the holding mode of the substrates W to shift from the second holding mode to the first holding mode. In contrast to this, the lid holder 23 moves forward integrally with the lid 3. The lid holder 23 moves forward, thereby separating the deepest part 24b of the lid holder 23 from the substrate W.

The lid 3 moves forward, thereby being separated from the rods 35 as illustrated in FIG. 5(a).

3.4. Example of Operation Upon Transportation of Substrate W from Substrate Container 1

Reference is made to FIGS. 4(a) and 4(b). The casing 2 is opened. All the substrates W within the casing 2 are held in the first holding mode. The lid 3 and the shutter 45a are disposed at the position P3. The holding arm 47a enters the casing 2. Specifically, the holding arm 47a enters a position below the rack 11 where one substrate W to be transported is placed. Then the holding arm 47a slightly moves upward to cause the one substrate W to float from the rack 11 and then hold the substrate W. Thereafter, the holding arm 47a exits out of the casing 2 while holding the substrate W. In this manner, the transport mechanism 47 transports the substrate W within the substrate container 1. Thereafter, the holding arm 47a unloads the substrate W to the treating unit 48.

4. Effect of Embodiment 1

Upon shifting from the first holding mode to the second holding mode, the casing lifting mechanism moves the casing holder 16 upward. The casing holder 16 moves the substrates W upward without sliding with the substrates W. Upon shifting from the second holding mode to the first holding mode, the casing lifting mechanism moves the casing holder 16 downward. The casing holder 16 moves the substrates W downward without sliding with the substrates W. Consequently, inhibited particle generation is obtainable between the substrates W and the casing holder 16. As a result, this achieves suppressed particle adhesion to the substrate W. In addition, the atmosphere within the substrate container 1 is able to be kept clean.

The casing lifting mechanism 31 moves the casing holder 16 upward/downward in response to attachment/detachment of the lid 3 to/from the casing 2. That is, the casing lifting mechanism moves the casing holder 16 upward/downward with use of movement of the lid 3. Accordingly, the casing lifting mechanism needs no power source for moving the casing holder 16 upward/downward. Moreover, the holding mode of the substrate W is switchable at a timing when the lid 3 is attached/detached to/from the casing 2.

Specifically, the casing lifting mechanism moves the casing holder 16 upward in response to attachment of the lid 3 to the casing 2. As a result, the substrates W are held in the second holding mode in the condition where the lid 3 is attached to the casing 2. Accordingly, the substrate container 1 is conveyable while the substrates W are suitably protected in the condition where the lid 3 is attached to the casing 2. Moreover, the casing lifting mechanism moves the casing holder 16 downward in response to detachment of the lid 3 from the casing 2. As a result, the substrates W are held in the first holding mode in the condition where the lid 3 is detached from the casing 2. Accordingly, the substrates W are suitably transported from the casing 2 in the condition where the lid 3 is detached from the casing 2.

The casing lifting mechanism includes the movable bases 34. Attachment of the lid 3 to the casing 2 causes the movable bases 34 to move backward. The backward movement of the movable bases 34 causes the casing holder 16 to move upward. Moreover, detachment of the lid 3 from the casing 2 causes the movable bases 34 to move forward. The forward movement of the movable bases 34 causes the casing holder 16 to move downward. In this manner, the movable bases 34 achieve suitable response of movement of the lid 3 to upward/downward movement of the casing holder 16.

The movable bases 34 each include the slope 34a. Accordingly, this achieves suitable association between forward/backward movement of the lid 3 and upward/downward movement of the casing holder 16. For instance, upon attachment of the lid 3 to the casing 2, the movable bases 34 receive a backward force from the lid 3. The movable bases 34 convert the downward force into an upward force to cause the casing holder 16 to move upward. Moreover, upon holding of the substrates W in the second holding mode, an own weight of the casing holder 16 acts on the movable bases 34, and thus does not act on the substrates W. That is, the casing holder 16 does not apply unnecessary force to the substrates W when the substrates W are held in the second holding mode. This allows more suitable protection of the substrates W.

The rods 35 are connected to the movable bases 34 and are contactable to the lid 3, thereby allowing transmission of the movement of the lid 3 to the movable bases 34. Moreover, the rod 35 transmits the movement of the lid 3 to the movable bases 34 without the substrates W. Accordingly, there is no possibility of unnecessary force application to the substrate W upon attachment/detachment of the lid 3 to/from the casing 2, leading to no risk of damages on the substrates W.

The casing lifting mechanism includes the spring 32. The spring 32 presses the casing holder 16 downward, thereby achieving stable upward movement of the casing holder 16. In addition, a restoring force stored in the spring 32 is used for promoted downward movement of the casing holder 16. Accordingly, the casing lifting mechanism allows smooth upward/downward movement of the casing holder 16. In other words, the spring 32 causes more smooth response of the movement of the lid 3 to the upward/downward movement of the casing holder 16.

The lid holder 23 contacts the substrate W only at the deepest part 24b, and thus does not slide with the substrate W when the mode sifts to any of the first and second modes. Consequently, inhibited particle generation is obtainable between the lid holder 23 and the substrates W.

The lid holder 23 made of an elastic resin achieves accurate substrate holding.

Moreover, the load port devices 420, 421, and 422 allow suitable placement of the substrate container 1.

The substrate treating apparatus 41 allows treatment, such as a liquid treatment or a heat treatment, to the substrates W accommodated in the substrate container 1.

Embodiment 2

The following describes Embodiment 2 of the present invention with reference to drawings. Like numerals are used to identify like components which are the same as in Embodiment 1 and will not particularly be described.

1. Configuration of Substrate Container

Reference is made to FIGS. 6(a) to 6(d). FIGS. 6(a) and 6(b), and FIGS. 6(c) and 6(d), each illustrate a side view on the left thereof and a front view on the right thereof The substrate container 1 includes a casing guiding mechanism. The casing guiding mechanism is disposed within the casing 2. The casing guiding mechanism guides the casing holder 16 so as to move upward/downward relative to the casing 2. The casing guiding mechanism includes a connecting bar 52 and a guiding member 53.

The connecting bar 52 is fixed on the casing holder block 14 (casing holder 16). The connecting bar 52 has a flat plate shape (i.e., a band shape). The guiding member 53 is fixed on the casing 2 (rear wall 8). The guiding member 53 includes a hole into which the connecting bar 52 is inserted. The hole is inclined relative to the forward/downward direction. More specifically, the hole is inclined so as to be higher toward backward. The connecting bar 52 is inserted into the hole. The connecting bar 52 is movable in parallel along the hole, but is not rotatable around an axis of the connecting bar 52. The connecting bar 52 slides relative to the guiding member 53, whereby the casing holder 16 moves forward/backward relative to the casing 2 while moving upward/downward relative to the casing 2. That is, a direction where the casing guiding mechanism guides the casing holder 16 includes an upward/downward component and a forward/backward component.

Figure 6B:
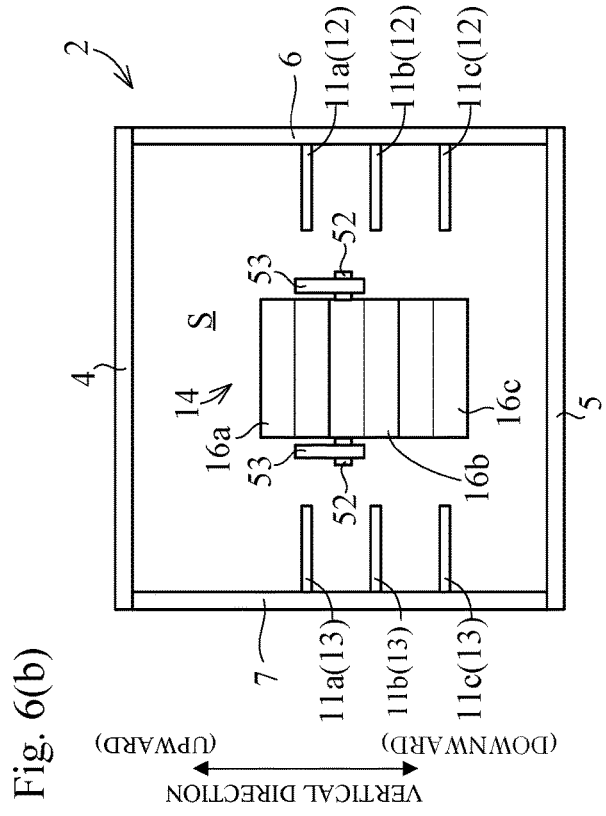
FIGS. 6(a) to 6(d) illustrate side views and front views of an interior of a casing according to Embodiment 2 of the present invention with the left wall 7 not shown in FIGS. 6(a) and 6(c).
Figure 6D:
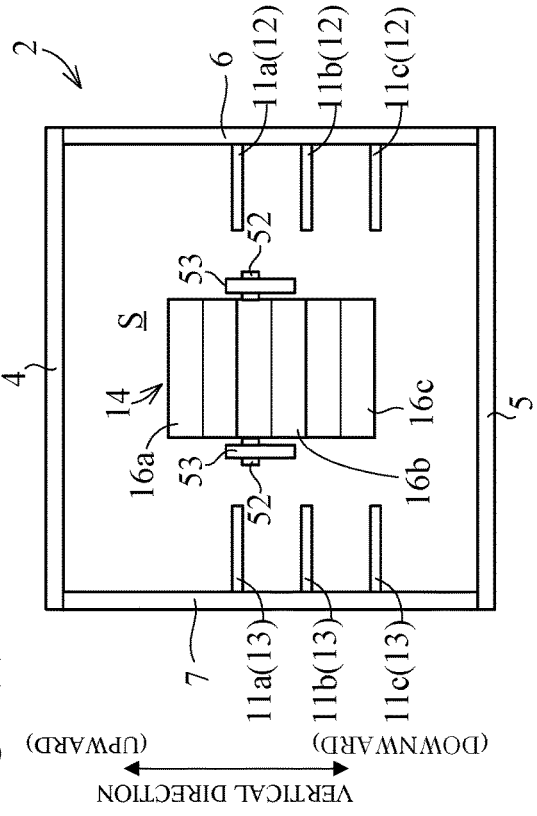
Figure 6A:
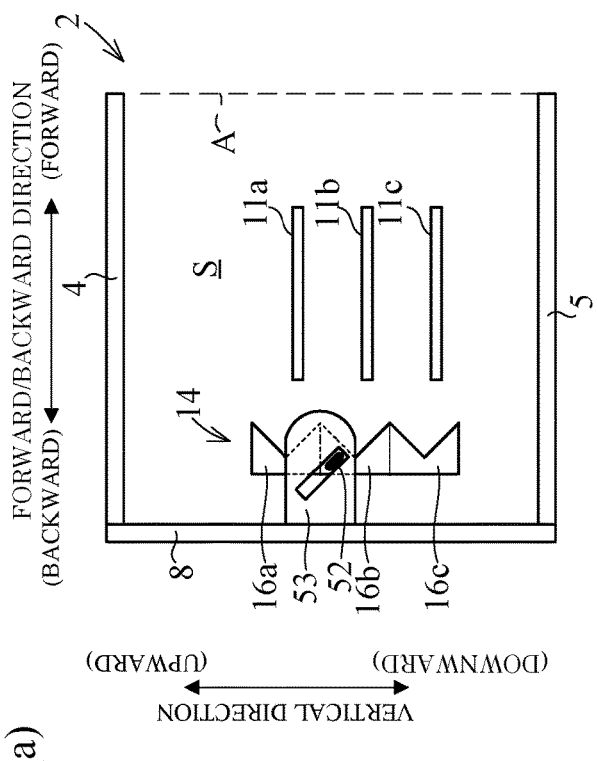
Figure 6C:
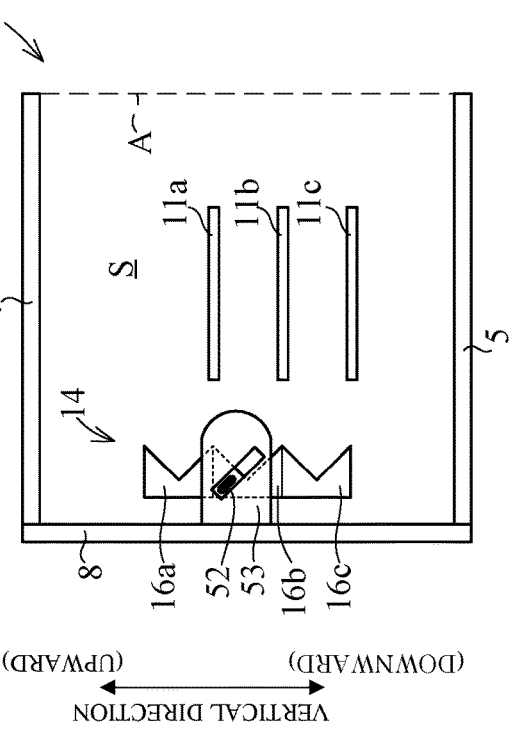

Hereinafter, a lowest position to which the casing holder 16 is movable is referred to as a "lower position", whereas a highest position to which the casing holder 16 is movable is referred to as an "upper position". FIGS. 6(a) and 6(b) illustrate the lower position of the casing holder 16, and FIGS. 6(c) and 6(d) illustrate the upper position of the casing holder 16.

Figure 7A:
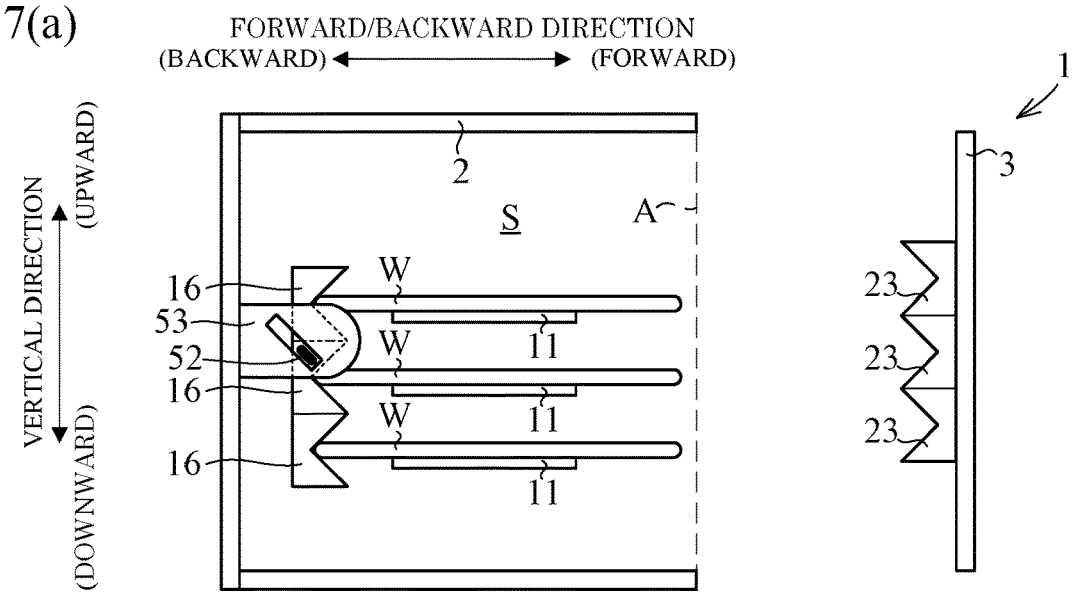
FIGS. 7(a) to 7(c) are each a side view with the left wall 7 not shown, illustrating the interior of the substrate container when a lid is attached/detached to/from the casing.
Figure 7B:
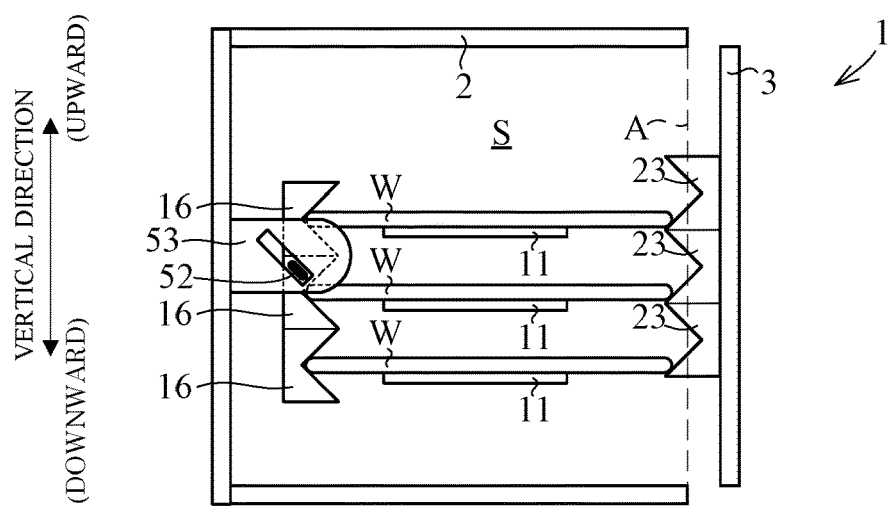
Figure 7C:
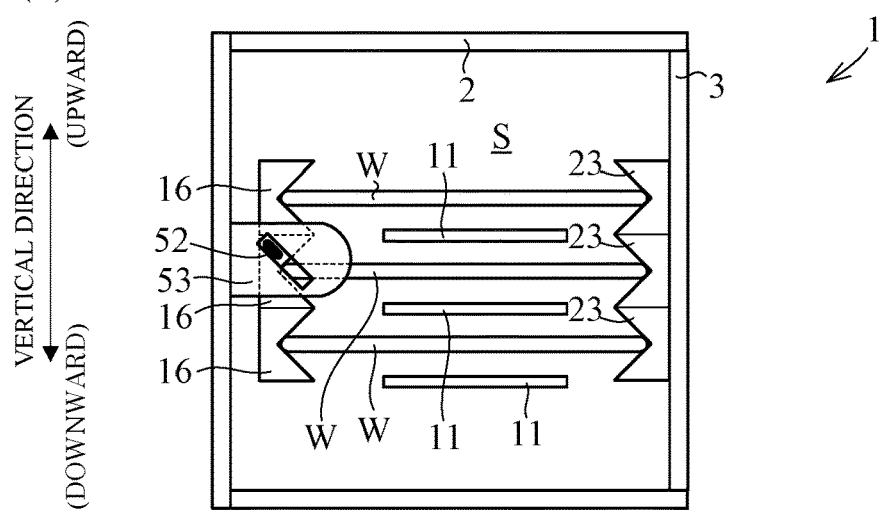

The following describes a positional relationship among the rack 11, the casing holder 16, and the lid holder 23 with reference to FIGS. 7(a) to 7(c). When the casing holder 16 is at the lower position, the deepest parts 17b of the casing holders 16a, 16b, and 16c are disposed at a substantially equal level to the ends of the substrates W placed on the rack 11a, 11b, and 11c, respectively. Here, a difference in level between the lower position and the upper position of the casing holder 16 is smaller than the pitch of the rack 11. The casing holder 16 is disposed so as for the downward slopes 24a of the lid holders 23a, 23b, and 23c to contact the ends of the substrate W placed on the racks 11a, 11b, and 11c, respectively, when the lid 3 faces to the opening A.

2. Example of Operation 2.1. Condition of Lid 3 Detached from Casing 2

Reference is made to FIG. 7. For instance, the lid 3 is disposed at a position illustrated in FIG. 7(a). The substrates W are held in the first holding mode. The casing holder 16 is at the lower position. The downward deepest parts 17b of the casing holder 16 contacts rear ends of the substrates W.

2.2. Example of Operation when Lid 3 is Attached to Casing 2

The lid 3 moves backward from the position in FIG. 7(a). When the lid 3 arrives at the position in FIG. 7(b), the downward slopes 24a of the lid holder 23 contact the front ends of the substrates W.

The lid 3 moves further backward, whereby the lid holder 23 presses the substrates W backward. This causes the front ends of the substrates W to slide up on the downward slopes 24a of the lid holder 23 and causes the substrates W to move backward. The substrates W move backward, thereby pressing the casing holder 16 backward. The casing holder 16 moves upward from the lower position in accordance with the casing guiding mechanism.

The casing holder 16 moves upward, thereby lifting the substrates W upward while holding the substrates W at the deepest part 17b. The front ends of the substrates W slide up on the downward slopes 24a.

Reference is made to FIG. 7(c). The lid 3 moves further backward to be attached to the casing 2. The casing holder 16 moves to the upper position while holding the substrates W. The front ends of the substrates W arrive at the deepest parts 24b. When attaching the lid 3 to the casing 2 is finished in this manner, the substrates W are held in the second holding mode. In the present embodiment, the substrates W are disposed in a substantially horizontal attitude when the substrates W are held in the second holding mode.

2.3. Example of Operation when Lid 3 is Detached from Casing 2

Reference is made to FIGS. 7(c) and 7(b). The lid 3 moves forward from the opening A (i.e., a position illustrated in FIG. 7(c)). The lid holder 23 moves forward integrally with the lid 3. This causes the casing holder 16 to move downward by its own weight while the casing holder 16 presses the substrates W forward. Specifically, the casing holder 16 moves from the upper position to the lower position in accordance with the casing guiding mechanism. The casing holder 16 moves downward, thereby moving the substrates W downward while holding the substrates W. Moreover, the front ends of the substrates W separates from the deepest parts 24b of the lid holder 23 to slide down on the downward slopes 23a. This causes the substrates W to be placed on the rack 11. In other words, the substrates W are held in the first holding mode.

When the lid 3 moves further forward, the lid holder 23 separates from the substrates W as in FIG. 7(a).

3.3. Effect of Embodiment 2

When the mode shifts from the first holding mode to the second holding mode, the casing holder 16 moves upward in accordance with the casing guiding mechanism. This causes the casing holder 16 to lift the substrates W upward while the casing holder 16 holds the substrates W. When the mode shifts from the second holding mode to the first holding mode, the casing holder 16 moves downward in accordance with the casing guiding mechanism. This causes the casing holder 16 to move the substrates W downward while the casing holder 16 holds the substrates W. Consequently, the substrates W do not slide with the casing holder 16 during shifting to the first holding mode and that to the second holding mode, leading to inhibited particle generation between the substrates W and the casing holder 16.

The casing holder 16 moves upward/downward in response to attachment/detachment of the lid 3 to/from the casing 2. That is, the casing holder 16 moves upward/downward with use of operation of the lid 3. Accordingly, the substrate container 1 needs no power source for moving the casing holder 16 upward/downward. Moreover, the holding mode of the substrates W is switchable at a timing of attaching/detaching the lid 3 to/from the casing 2.

Since the casing holder 16 moves upward in response to attachment of the lid 3 to the casing 2, the substrates W are held in the second holding mode in the condition where the lid 3 is attached to the casing 2. Consequently, the substrate container 1 is suitably conveyable in the condition where the substrate container 1 is closed. Moreover, since the casing holder 16 moves downward in response to detachment of the lid 3 from the casing 2, the substrates W are held in the first holding mode in the condition where the lid 3 is detached from the casing 2. Consequently, the substrates W are suitably unloadable from the substrate container 1 in the condition where the substrate container 1 is opened.

Operation of the lid 3 (lid holder 23) causes movement of the substrates W, and the movement of the substrates W causes the casing holder 16 to move upward/downward. In this manner, the substrates W cause the casing holder 16 to move upward/downward with use of the operation of the lid 3. Accordingly, the substrate container 1 needs no mechanism, such as the casing lifting mechanism in Embodiment 1 according to Embodiment 1, leading to a simplified configuration of the substrate container 1.

The casing holder 16 moves in accordance with the casing guiding mechanism, leading to a constant lower position of the casing holder 16. For instance, this achieves suitably suppressed horizontal variation in lower position of the casing holder 16, the variation being caused by every upward/downward movement of the casing holder 16. Consequently, the casing holder 16 is able to move the substrate W downward to the same position every time the casing holder 16 moves downward. Accordingly, the position of the substrates W on the rack 11 is kept constant every time the mode shifts to the first holding mode. In other words, inhibited variation in position of the substrates W is obtainable, the variation being caused by every shift of the mode to the first holding mode. This achieves more suitable transportation of the substrates W from the casing 2.

The hole of the guiding member 53 is inclined relative to the forward/backward direction. Consequently, the guiding member 53 allows conversion of forward/backward movement of the lid 3 to upward/downward movement of the casing holder 16. In addition, the connecting bar 52 is inserted into the hole. Accordingly, this suitably prevents the casing holder 16 from rotating around the axis of the connecting bar 52.

The direction where the casing guiding mechanism guide the casing holder 16 includes the forward/backward component in addition to the upward/downward component. The casing holder 16 is movable horizontally (forward/backward). Consequently, the gap between the casing holder 16 and the lid holder 23 (strictly speaking, the gap between the deepest part 17b and the deepest part 24b) is able to conform to the external dimension of the substrates W. As a result, the casing holder 16 and the lid holder 23 allows suitably holding of the substrates W in the second holding mode even when the external dimension of the substrates W includes some variations or deviations.

When the substrates W are held in the second holding mode, the substrates W are pressed with the casing holder 16 by its own weight against the lid holder 23. This allows the casing holder 16 and the lid holder 23 to nip the substrates W while the casing holder 16 and the lid holder 23 press the substrates W appropriately. Moreover, the gap between the casing holder 16 and the lid holder 23 is variable by itself so as to follow the external dimension of the substrate W. This achieves smooth shift to the second holding mode.

Embodiment 3

The following describes Embodiment 3 of the present invention with reference to drawings. Like numerals are used to identify like components which are the same as in Embodiment 1 and will not particularly be described.

1. Configuration of Substrate Container

Figure 8:
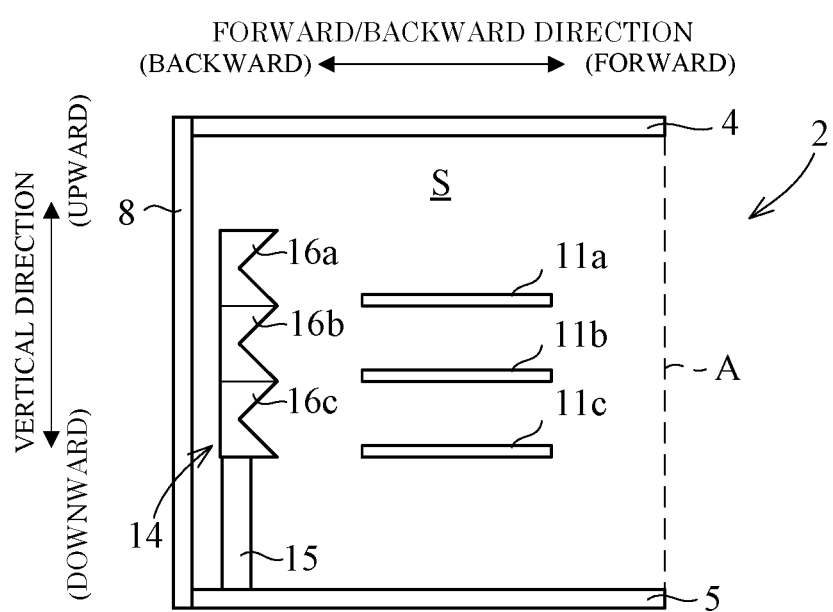
FIG. 8 is a side view of an interior of a casing according to Embodiment 3 of the present invention, with the left wall 7 not shown.

Reference is made to FIG. 8. The casing holder block 14 is fixed on the casing 2 via a fixing arm 15. The casing holder 16 is immovable relative to the casing 2. The casing holder 16 is disposed such that the downward slopes 17a of the casing holders 16a, 16b, and 16c contact the ends of the substrates W on the racks 11a, 11b, and 11c, respectively.

Reference is made to FIGS. 9(a) to 9(d). FIGS. 9(a) to 9(d) each illustrates a front view and a side view of the lid 3. The substrate container 1 includes a locking mechanism and a lid lifting mechanism 65.

The locking mechanism 61 locks the lid 3 to the casing 2. The locking mechanism 61 includes keyways 62, gears 63, and coupling members 64. The keyways 62 are placed on the surface of the lid 3. A key for operating the locking mechanism is inserted in each of the keyways 62. Operation of the key causes the gear 63 to rotate in forward and reverse directions. The coupling member 64 is interlocked with the gear 63. Rotation of the gear 63 causes the coupling member 64 to move between a retracting position and a projecting position. In the retracting position, the coupling member 64 is entirely accommodated within the lid 3 (see FIGS. 9(a) and 9(b)). In the projecting position, the coupling member 64 partially projects externally from the lid 3 (see FIGS. 9(c) and 9(d)).

The lid open/close mechanism 45 operates the locking mechanism. Specifically, the lid open/close mechanism 45 includes a key (not shown). The lid open/close mechanism 45 inserts the key into the keyway 62 to operate the locking mechanism. The casing 2 includes recesses (not shown) for mating connection with the coupling member 64 in the projecting position. When the coupling member 64 moves to the projecting position in the condition where the lid 3 is attached to the casing 2, the coupling member 64 and the recess couple to lock the lid 3 to the casing 2. That is, the lid 3 is undetachable from the casing 2. When the coupling member 64 moves to the retracting position in the condition where the lid 3 is attached to the casing 2, the coupling member 64 is separated from the recess to unlock the lid 3 from the casing 2. That is, the lid 3 is detachable from the casing 2.

The lid lifting mechanism 65 moves the lid 3 upward/downward relative to the lid holder 23 in response to of the locking mechanism. The lid lifting mechanism 65 includes gears 66 and a rack 67. The gears 66 each engage the gears 63. The rack 67 is interlocked with the gears 66. Rotation of the gears 63 causes the gears 66 to rotate, whereby the rack 67 moves upward/downward. In this manner, the lid lifting mechanism 65 is interlocked with the locking mechanism.

The lid holder block 21 is fixed to the rack 67. When the coupling member 64 moves to the projecting position, the lid holder 23 moves upward. When the coupling member 64 moves to the retracting position, the lid holder 23 moves downward. Hereinunder, a position of the lid holder 23 when the coupling member 64 is at the retracting position is referred to as a "lower position". Moreover a position of the lid holder 23 when the coupling member 64 is at the projecting position is referred to as an "upper position".

Figure 10A:
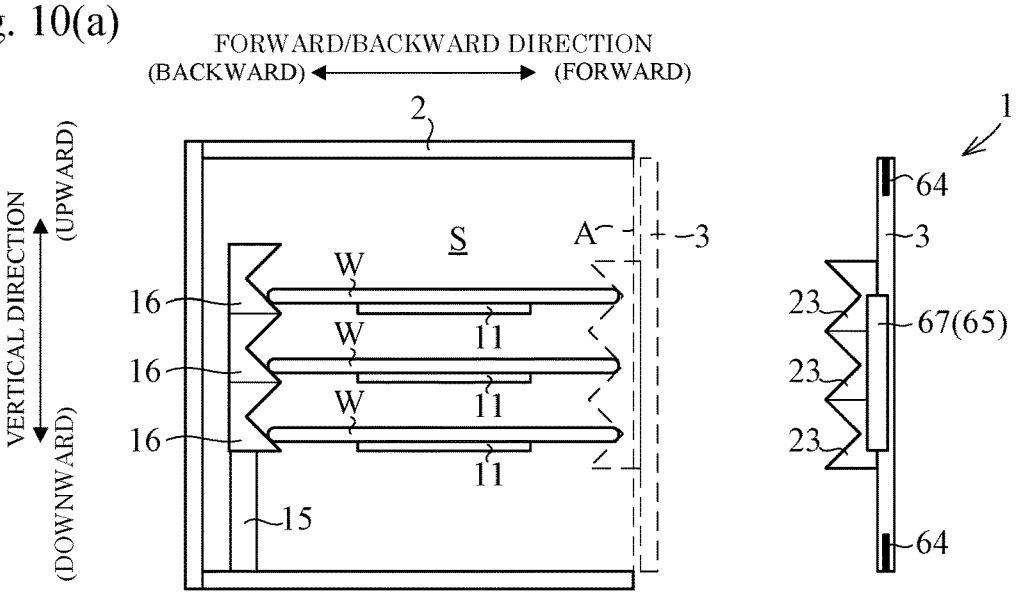
FIGS. 10(a) to 10(c) are each a side view with the left wall 7 not shown, illustrating the interior of the substrate container when the lid is attached/detached to/from the casing.
Figure 10B:
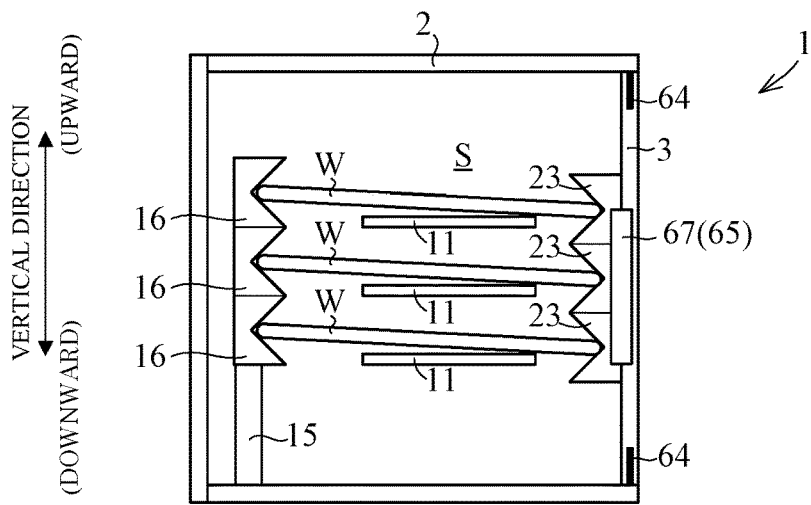
Figure 10C:
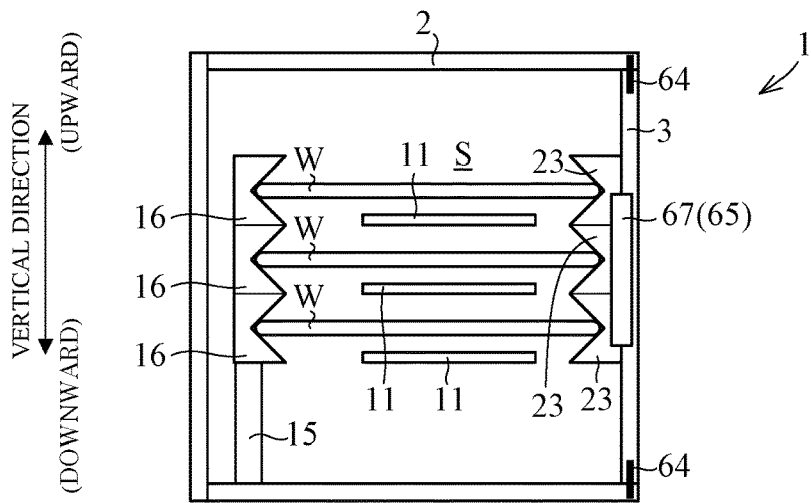

Reference is made to FIGS. 10(a) to 10(c). When the lid 3 faces to the opening A and the lid holder 23 is at the lower position, the deepest parts 24b of the lid holders 23a, 23b, and 23c are disposed at positions substantially equal in level to the end faces of the substrates W on the racks 11a, 11b, and 11c, respectively. A difference in level between the lower position and the upper position of the lid holder 23 is smaller than the pitch of the rack 11.

2. Example of Operation 2.1. Condition when Lid 3 is Detached from Casing 2

Reference is made to FIG. 10(a). The lid 3 is disposed at a position denoted by solid lines, for example. The substrates W are held in the first holding mode. The coupling member 64 is at the retracting position, whereas the lid holder 23 is at the lower position. The casing holder 16 contacts the substrates W at the downward slopes 17a.

2.2. Example of Operation when Lid 3 is Attached to Casing 2

Reference is made to FIG. 10(a). The lid 3 moves backward from the position illustrated by the solid lines. When the lid 3 reaches a position illustrated by dotted lines, the deepest parts 24b of the lid holder 23 contact the front ends of the substrates W.

Reference is made to FIG. 10(b). The lid 3 moves to the opening A to be attached to the casing 2. The lid holder 23 presses the substrates W backward. This causes the rear ends of the substrates W to slide up on the downward slopes 17a to the deepest parts 17b. Here, the front ends of the substrates W are kept held at the deepest parts 24b of the lid holder 23.

Reference is made to FIG. 10(c). The locking mechanism locks the lid 3 to the casing 2. Specifically, the coupling member 64 moves from the retracting position to the projecting position to lock the lid 3 to the casing 2. The lid lifting mechanism 65 moves the lid holder 23 from the lower position to the upper position in response to such operation of the locking mechanism (i.e., movement of the coupling member 64). This causes the lid holder 23 to move the substrates W upward while the lid holder 23 holds the substrates W. The substrates W floats above the rack 11, and are held in the second holding mode.

2.3. Example of Operation when Lid 3 is Detached from Casing 2

When the lid 3 is detached from the casing 2, transition is made to conditions from FIG. 10(c) through FIG. 10(b) to FIG. 10(a). The following describes the above transition briefly.

Reference is made to FIGS. 10(c) and 10(b). The coupling member 64 moves from the projecting position to the retracting position to cause the locking mechanism to unlock the lid 3. The lid lifting mechanism 65 moves the lid holder 23 downward in response to such operation of the locking mechanism (movement of the coupling member 64). The downward movement of the lid holder 23 causes the substrates W to move downward while the lid holder 23 holds the substrates W.

Reference is made to FIG. 10(a). The lid 3 moves forward from the opening A to the position illustrated by the dotted lines. Here, the rear ends of the substrates W separate from the deepest parts 17b, and the substrates W slide down on the downward slopes 17a. As a result, the substrates W are placed on the rack 11. That is, the substrates W are held in the first holding mode. When the lid 3 moves further forward from the position illustrated by the dotted lines, the lid holder 23 separates the substrates W.

3. Effect of Embodiment 3

When the mode shifts to the second holding mode, the lid lifting mechanism 65 moves the lid holder 23 upward. This causes the lid holder 23 to move the substrates W upward without sliding with the substrates W. When the mode shifts to the first holding mode, the lid lifting mechanism 65 moves the lid holder 23 downward. This causes the lid holder 23 to move the substrates W without sliding with the substrates W. Consequently, inhibited particle generation is obtainable between the substrates W and the lid holder 23 when the mode shifts to the first and second holding modes, respectively.

The lid lifting mechanism 65 moves the lid holder 23 upward/downward relative to the casing 2 in response to locking of the lid 3 to the casing 2 and unlocking of the lid 3 from the casing 2. Accordingly, the lid lifting mechanism 65 needs no power source for moving the lid holder 23 upward/downward. Moreover, the holding mode of the substrate W is switchable at a timing of locking/unlocking of the lid 3 to/from the casing 2.

Specifically, the lid lifting mechanism 65 moves the lid holder 23 upward in response to locking of the lid 3 to the casing 2. This achieves holding of the substrates W in the second holding mode in the condition where the lid 3 is locked to the casing 2. Moreover, the lid lifting mechanism 65 moves the lid holder 23 downward in response to unlocking of the lid 3 from the casing 2. This achieves holding of the substrates W in the first holding mode in the condition where the lid 3 is unlocked from the casing 2. Accordingly, the substrate container 1 is suitably conveyable in the condition where the lid 3 is locked to the casing 2. Moreover, the lid 3 is detached in the condition where the lid 3 is unlocked from the casing 2, whereby the substrates W are suitably transported from the substrate container 1.

The lid lifting mechanism 65 is interlocked with the locking mechanism to move the lid holder 23 upward/downward with use of operation of the locking mechanism. This achieves a simplified configuration and reduction in size of the lid lifting mechanism 65.

Moreover, the direction where the lid lifting mechanism 65 moves the lid holder 23 upward/downward includes no horizontal component. Consequently, there is no possibility that the substrates W are deviated horizontally when the lid holder 23 moves the substrates W upward/downward. This achieves a constant lower position of the lid holder 23. As a result, the substrates W are disposed on the rack 11 at a constant position every time the mode shifts to the first holding mode.

Embodiment 4

The following describes Embodiment 4 of the present invention with reference to drawings. Like numerals are used to identify like components which are the same as in Embodiment 1 and will not particularly be described.

1. Configuration of Substrate Container

Reference is made to FIGS. 11(a) to 11(d). The substrate container 1 includes a lid lifting mechanism and a lid guiding mechanism. The lid lifting mechanism moves the lid holder 23 upward/downward relative to the lid 3. The lid guiding mechanism guides the lid holder 23.

The lid lifting mechanism includes a lid connecting board 72. The lid connecting board 72 is fixed on the lid holder block 21 (lid holder 23). The lid connecting board 72 extends downward from the lid holder block 21. The lid connecting board 72 moves integrally with the lid holder 23.

Figure 12A:
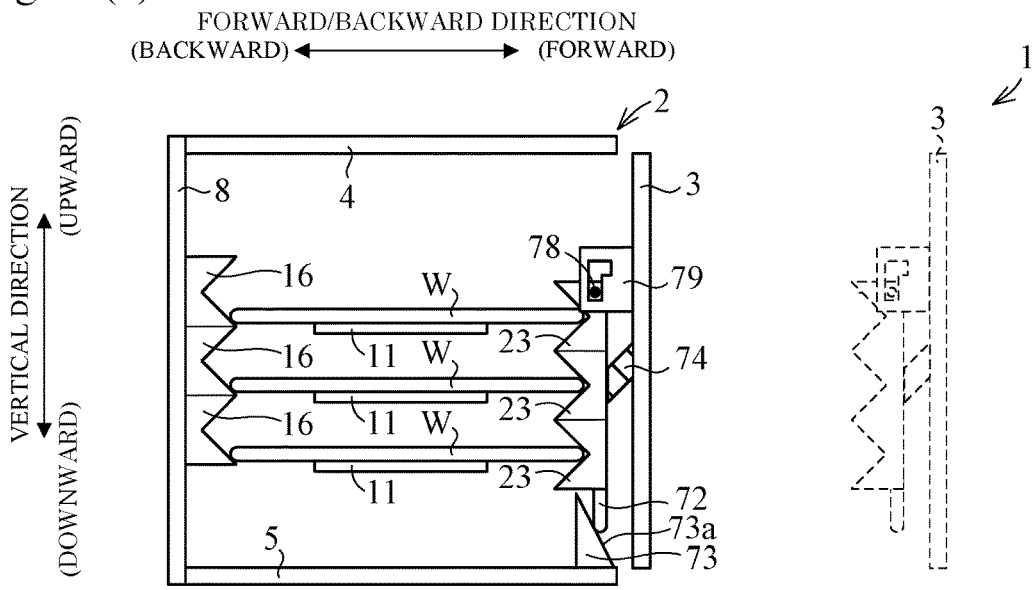
FIGS. 12(a) to 12(c) are each a side view with the left wall 7 not shown, illustrating an interior of the substrate container when the lid is attached/detached to/from the casing.

Reference is made to FIG. 12(a). The lid lifting mechanism further includes a fixed base 73. The fixed base 73 is fixed within the casing 2. Specifically, the fixed base 73 is fixed on the bottom plate 5 so as to be immovable relative to the casing 2. A fixed base 73 is disposed a position where the fixed base 73 is contactable to the lid connecting board 72. The fixed base 73 includes a slope 73a that contacts the lid connecting board 72 to guide the lid connecting board 72. The slope 73a is inclined relative to the forward/backward direction. In the present embodiment, the slope 73a is inclined to be higher in level toward backward.

In Embodiment 4, the casing holder 16 is directly fixed on the casing 2 (rear wall 8). The casing holder 16 is disposed such that the downward slopes 17a of the casing holders 16a, 16b, and 16c are contactable to the ends of the substrates W on the racks 11a, 11b, and 11c, respectively.

Reference is made to FIGS. 11(b) to 11(d). The lid lifting mechanism further includes a spring 74. The spring 74 is, for example, a compressive coil spring. The spring 74 includes a first end fixed on the lid 3 (rear face 3b) and a second end connected to the lid holder block 21 (lid holder 23). The spring 74 expands/contracts and bends following the movement of the lid holder 23. Specifically, the lid holder 23 moves in the substantially horizontal direction relative to the lid 3, whereby the spring 74 expands and contracts. Moreover, the lid holder 23 moves in the upward/downward direction relative to the lid 3, whereby the spring 74 bends. Here, the substantially horizontal direction corresponds to the forward/backward direction, for example. For instance, the lid holder 23 approaches the lid 3, whereby the spring 74 elastically deforms and applies a restoring force to the lid holder 23 in the direction where the lid holder 23 moves away from the lid 3. When the lid 3 faces to the opening A, the lid holder 23 moves away from the lid 3, whereby the spring 74 compressively deforms and presses the lid holder 23 toward the casing holder 16. The spring 74 is one example of the lid elastic member in the present invention.

The lid guiding mechanism includes a connecting pin 78 and a guiding member 79. The connecting pin 78 is fixed on the lid holder block 21 (lid holder 23). The guiding member 79 is fixed on the lid 3. The guiding member 79 has a hole into which the connecting pin 78 is inserted. The hole bends in a substantially L-shape. One part of the hole partially extends in parallel relative to the upward/downward direction, whereas the other part thereof extends in parallel relative to the forward/backward direction. The connecting pin 78 is inserted into the hole. The connecting pin 78 slides along the hole of the guiding member 79, whereby the lid holder 23 moves upward/downward and forward/downward relative to the lid 3.

Here, the positions of the lid holder 23 in FIGS. 11(b), 11(c), and 11(d) are referred to as a "lower position", an "upper position", and a "retraction position", respectively. The lower position is immediately below the upper position, and lower in level than the upper position. The retraction position is equal in level to the upper position. The lid guiding mechanism guides the lid holder 23 in the upward/downward direction between the lower position and the upper position. Moreover, the lid guiding mechanism also guides the lid holder 23 in the forward/backward direction between the upper position and the retraction position.

Figure 12B:
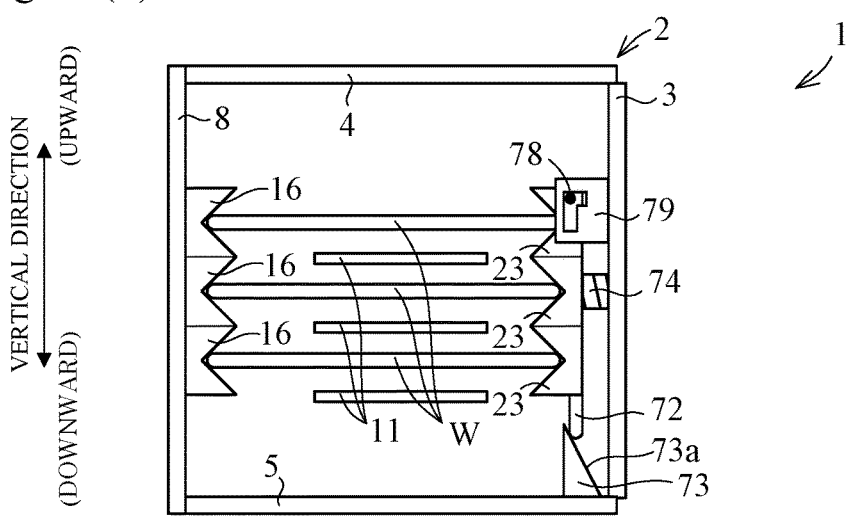
Figure 12C:
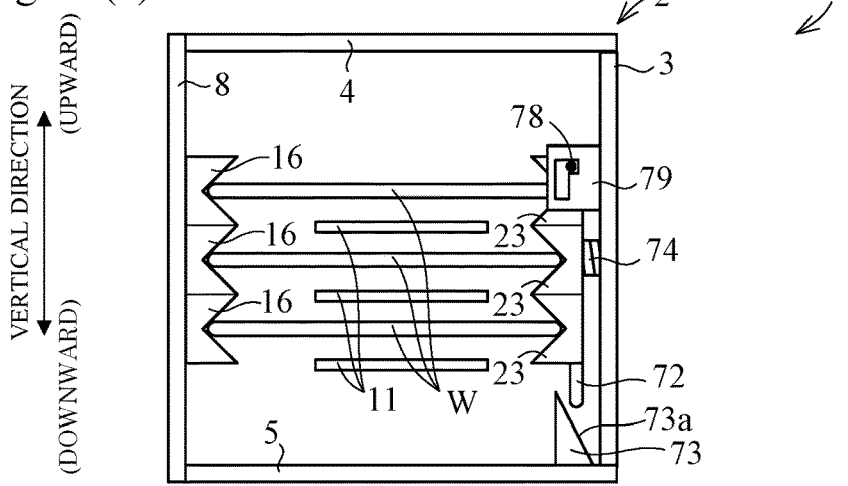

Reference is made to FIGS. 12(a) to 12(c). When the lid 3 faces to the opening A and the lid holder 23 is at the lower position, the deepest parts 24b of the lid holders 23a, 23b, and 23c are disposed at the substantially same level as the ends of the substrates W on the racks 11a, 11b, and 11c. A difference in level between the lower position and the upper position of the lid holder 23 is smaller than the pitch of the rack 11.

2. Example of Operation 2.1. Condition when Lid 3 is Detached from Casing 2

Reference is made to FIG. 12(a). The lid 3 is disposed at a position denoted by dotted lines, for example. The substrates W are held in the first holding mode. The lid holder 23 is at the lower position. The downward slopes 17a of the casing holder 16 contact the rear ends of the substrates W.

2.2. Example of Operation when Lid 3 is Attached to Casing 2

When the lid 3 moves to the position illustrated by solid lines in FIG. 12(a), the deepest parts 24b of the lid holder 23 contact the front ends of the substrates W, and the lid connecting board 72 contacts the fixed base 73.

Reference is made to FIG. 12(b). When the lid 3 moves further backward, the lid connecting board 72 slides up on the slope 73a, and the lid holder 23 moves upward in accordance with the lid guiding mechanism. Such upward movement of the lid holder 23 causes the lid holder 23 to lift the substrates W upward. Moreover, the lid holder 23 presses the substrates W backward. This causes the rear ends of the substrates W to slide up the downward slopes 17a of the casing holder 16.

When the lid holder 23 reaches the upper position and the rear ends of the substrates W reaches the deepest parts 17b, the substrates W are held in the second holding mode.

Reference is made to FIG. 12(c). The lid 3 moves to the opening A to be attached to the casing 2. The lid holder 23 approaches the lid 3 while receiving a reaction force from the substrates W, whereby the spring 74 compressively deforms. Specifically, the lid holder 23 moves from the upper position to the retraction position in accordance with the lid guiding mechanism. Here, the substrates W are kept held in the second holding mode.

2.3. Example of Operation when Lid 3 is Detached from Casing 2

When the lid 3 is detached from the casing 2, transition is made to conditions from FIG. 12(c) through FIG. 12(b) to FIG. 12(a). This is to be described hereinunder simply.

Reference is made to FIGS. 12(c) and 12(b). When the lid 3 moves forward from the opening A, the spring 74 restores and the lid holder 23 moves away from the lid 3. Specifically, the lid holder 23 moves from the retraction position to the upper position in accordance with the lid guiding mechanism.

When the lid 3 moves from the position in FIG. 12(b) to the position in FIG. 12(a) illustrated by dotted lines, the lid lifting mechanism moves the lid holder 23 downward. Specifically, the lid connecting board 72 slides down on the slope 73a, and the lid holder 23 moves from the upper position to the lower position in accordance with the lid guiding mechanism. Such downward movement of the lid holder 23 causes the lid holder 23 to move the substrates W downward and place the substrates W on the rack 11. Moreover, the rear ends of the substrates W separates from the deepest parts 17b of the casing holder 16 and slide down on the downward slopes 17a. Consequently, the substrates W are held in the first holding mode.

When the lid 3 moves to the position illustrated by solid lines in FIG. 12(a), the lid holder 23 separates the substrates W.

3. Effect of Embodiment 4

When the mode shifts to the second holding mode, the lid lifting mechanism moves the lid holder 23 upward. The lid holder 23 lifts up the substrates W without sliding with the substrates W. When the mode shifts to the first holding mode, the lid lifting mechanism moves the lid holder 23 downward. The lid holder 23 moves the substrates W downward without sliding with the substrates W. Consequently, inhibited particle generation is obtainable between the substrates W and the lid holder 23 when the mode shifts to the first and second holding modes, respectively.

The lid lifting mechanism moves the lid holder 23 upward/downward in response to attachment/detachment of the lid 3 to/from the casing 2. That is, the lid lifting mechanism moves the lid holder 23 upward/downward with use of operation of the lid 3. Consequently, the lid lifting mechanism needs no power source for moving the lid holder 23 upward/downward. In addition, the holding mode of the substrates W is switchable at a timing of attaching/detaching the lid 3 to/from the casing 2.

The lid lifting mechanism moves the lid holder 23 upward in response to attachment of the lid 3 to the casing 2. Accordingly, the substrates W are held in the second holding mode in the condition where the lid 3 is attached to the casing 2. Moreover, the lid lifting mechanism moves the lid holder 23 downward in response to detachment of the lid 3 from casing 2. Accordingly, the substrates W are held in the first holding mode in the condition where the lid 3 is detached from the casing 2. As a result, the substrate container 1 is suitably conveyable in the condition where the lid 3 is attached to the casing 2, and the substrates W are suitably unloadable from the substrate container 1 in the condition where the lid 3 is detached from the casing 2.

The fixed base 73 is fixed within the casing 2. The slope 73a of the fixed base 73 slides with the lid holder 23 (indirectly) to move the lid holder 23 upward/downward when the lid 3 is attached/detached to/from the casing 2. The fixed base 73 achieves relative conversion between forward/backward movement of the lid 3 and upward/downward movement of the lid holder 23.

When the substrate W are held in the second holding mode, an own weight of the lid holder 23 acts on the fixed base 73, and thus does not act on the substrates W. That is, the lid holder 23 does not apply unnecessary force to the substrates W when the substrates W are held in the second holding mode. This achieves more suitable protection of the substrates W.

The lid holder 23 is disposed movably in the horizontal direction (specifically, the forward/backward direction). This causes a gap between the casing holder 16 and the lid holder 23 to follow the external dimension of the substrate W. Consequently, the casing holder 16 and the lid holder 23 are able to hold the substrates W in the second holding mode suitably when the external dimension of the substrates W includes some variations or deviations.

The spring 74 presses the lid holder 23 backward in the condition where the lid 3 is attached to the casing 2. The lid holder 23 presses the substrates W against the casing holder 16. This allows automatic adjustment of the gap between the casing holder 16 and the lid holder 23 depending on the external dimension of the substrates W. In addition, the casing holder 16 and the lid holder 23 are able to nip the substrates W by an appropriate strength.

The lid holder 23 moves in accordance with the lid guiding mechanism, leading to a constant lower position of the lid holder 23. For instance, horizontal deviation in lower position of the lid holder 23 is suitably avoidable every time the lid holder 23 moves upward/downward. Consequently, the substrates W on the rack 11 are disposed at a constant position every time the mode shifts to the first holding mode. In other words, deviation in position of the substrates W held in the first holding mode is avoidable.

Specifically, the direction where the lid guiding mechanism guides the lid holder 23 between the lower position and the upper position includes only a vertical component, and thus includes no horizontal component. Consequently, there is no possibility that the lower position of the lid holder 23 shifts horizontally. As a result, the positions of the substrates W on the rack 11 are certainly kept constant every when the mode shifts to the first holding mode.

Embodiment 5

The following describes Embodiment 5 of the present invention with reference to drawings. Like numerals are used to identify like components which are the same as in Embodiments 1 and 3, and thus will not particularly be described.

1. Configuration of Substrate Container

Reference is made to FIGS. 13(a) to 13(d). FIGS. 13(a) to 13(d) illustrate front views and side views of the lid 3. The substrate container 1 includes a lid guiding mechanism 81. The lid guiding mechanism 81 guides the lid holder 23 so as to move upward/downward relative to the lid 3. The lid guiding mechanism 81 includes a connecting pin 82 and the guiding member 83. The connecting pin 82 is fixed on the lid holder block 21 (lid holder 23). The guiding member 83 is fixed on the lid 3. The guiding member 83 has a hole into which the connecting pin 82 is inserted. The hole is inclined relative to the forward/downward direction. More specifically, the hole is inclined so as to be higher toward forward. The connecting pin 82 is inserted into the hole. The connecting pin 82 slides relative to the guiding member 83, whereby the lid holder 23 moves forward/backward while moving upward/downward relative to the lid 3. That is, the direction where the lid guiding mechanism 81 guides the lid holder 23 includes both a vertical component and a horizontal component.

Figure 13C:
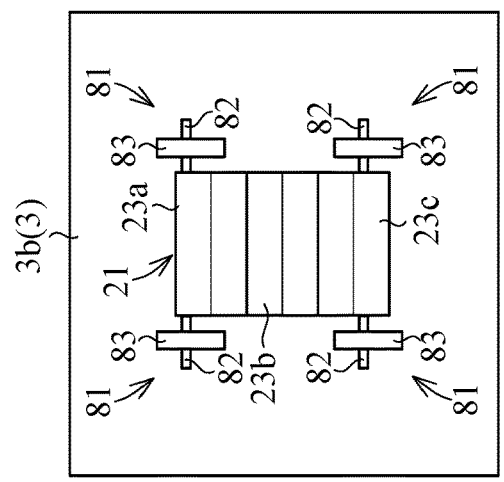
FIGS. 13(a) to 13(d) are back views and side views of a lid according to Embodiment 5 of the present invention.
Figure 13D:
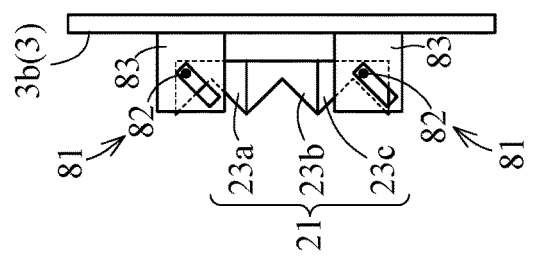
Figure 13B:
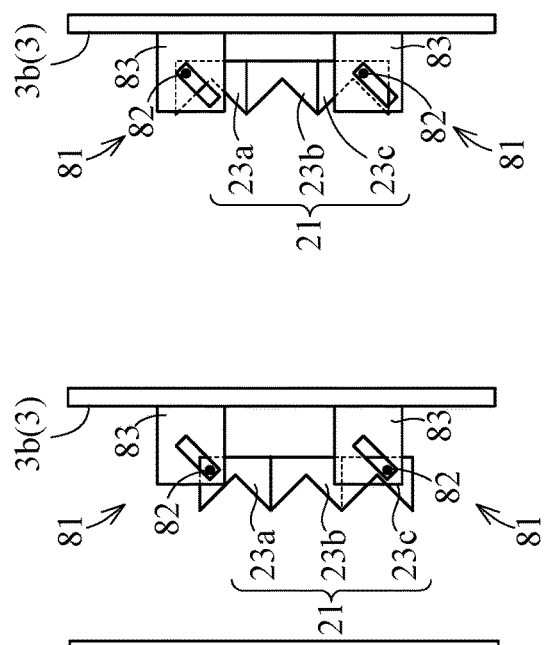
Figure 13A:
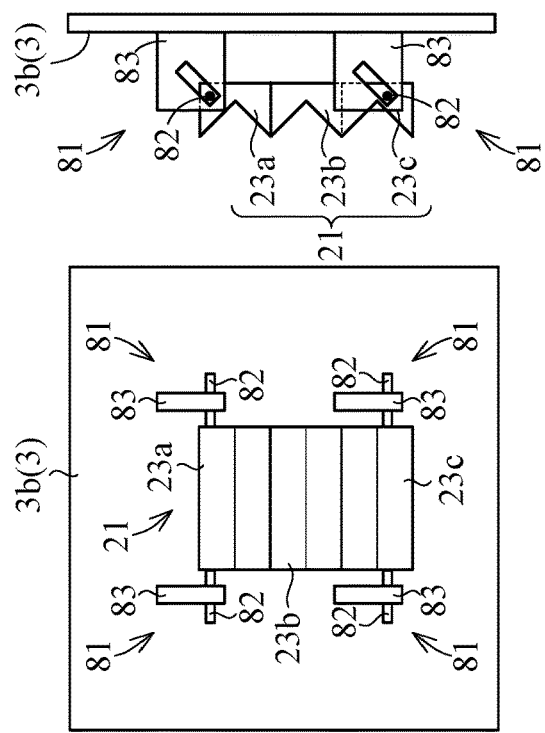

Hereunder, in FIGS. 13(a) to 13(d), a lowest position to which the lid holder 23 is movable is referred to as a "lower position", whereas a highest position to which the lid holder 23 is movable is referred to as an "upper position". FIGS. 13(a) and 13(b) illustrate the lower position of the lid holder 23, and FIGS. 13(c) and 13(d) illustrate the upper position of the lid holder 23.

Figure 14A:
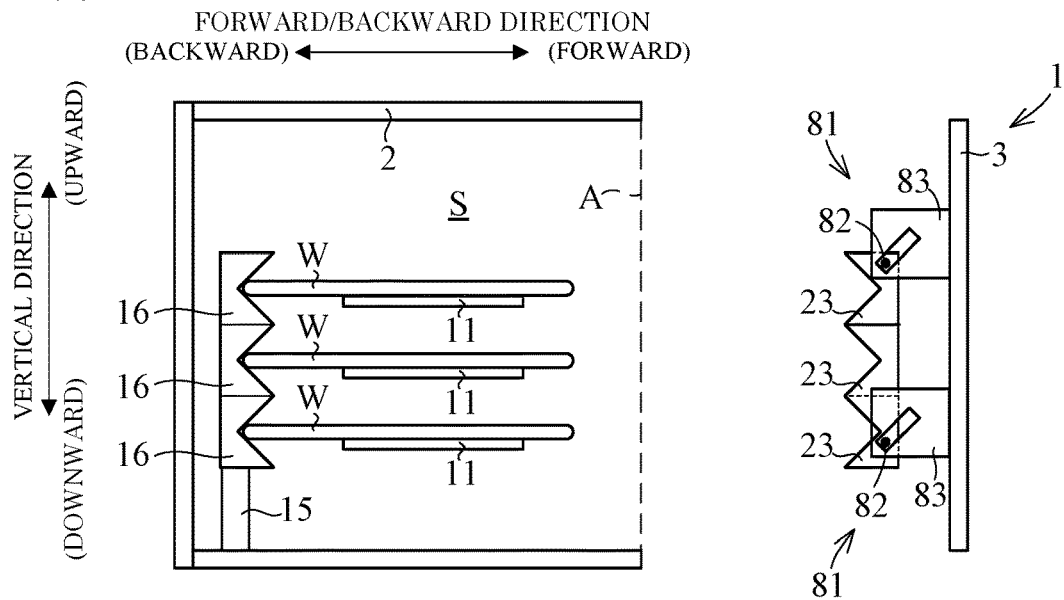
FIGS. 14(a) to 14(c) are each a side view with the left wall 7 not shown, illustrating an interior of the substrate container when the lid is attached/detached to/from the casing.
Figure 14B:
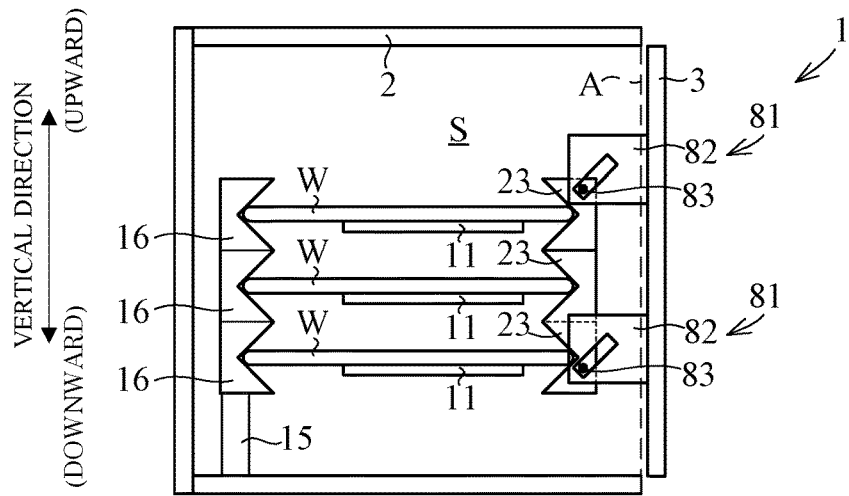
Figure 14C:
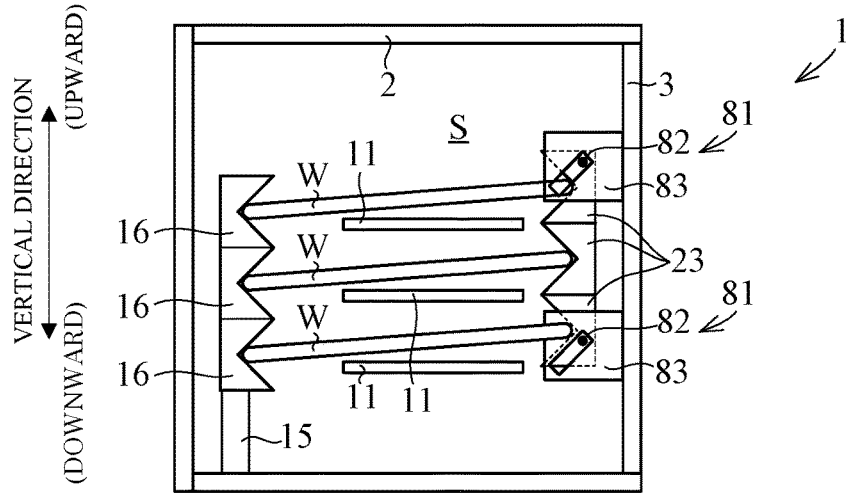

Reference is made to FIGS. 14(a) to 14(c). The casing holder 16 is fixed on the casing 2 via the fixing arm 15. The deepest parts 17b of the casing holder 16 are disposed at the substantially same level as the ends of the substrates W on the rack 11.

When the lid 3 faces to the opening A and the lid holder 23 is at the lower position, the deepest parts 24b of the lid holder 23 are disposed at the substantially same level as the ends of the substrates W on the rack 11. A difference in level between the lower position and the upper position of the lid holder 23 is smaller than the pitch of the rack 11.

2. Example of Operation 2.1. Condition of Lid 3 Detached from Casing 2

Reference is made to FIG. 14(a). For instance, the lid 3 is disposed at a position illustrated in FIG. 14(a). The substrate W is held in the first holding mode. The deepest parts 17b of the casing holder 16 contact the substrates W. The lid holder 23 is at the lower position.

2.2. Example of Operation when Lid 3 is Attached to Casing 2

The lid 3 moves from the position in FIG. 14(a) to the position in FIG. 14(b), the deepest parts 24b of the lid holder 23 contact the front ends of the substrates W.

When the lid 3 moves further backward, the lid holder 23 is subjected to a forward pressing force (reaction force) from the substrates W. This causes the lid holder 23 to move upward while approaching the lid 3. Specifically, the lid holder 23 moves upward from the lower position in accordance with the lid guiding mechanism 81. The lid holder 23 moves upward, thereby lifting up the substrates W while holding the substrates W at the deepest parts 17b. At this time, the rear ends of the substrate W are kept held with the deepest parts 17b of the casing holder 16.

Reference is made to FIG. 14(c). The lid 3 moves to the opening A to be attached to the lid 3. The lid holder 23 reaches the upper position. This causes the substrates W to be held in the second holding mode.

2.3. Example of Operation when Lid 3 is Detached from Casing 2

Reference is made to FIGS. 14(c) and 14(b). When the lid 3 moves forward from the opening A, the lid holder 23 moves downward by its own weight. Specifically, the lid holder 23 moves from the upper position to the lower position in accordance with the lid guiding mechanism 81. The lid holder 23 moves downward, thereby moving the substrates W downward and placing the substrates W on the rack 11 while holding the substrates W. Accordingly, the substrates W are held in the first holding mode.

When the lid 3 moves further forward, the lid holder 23 separates the substrates W as in FIG. 14(a).

3. Effect of Embodiment 5

When the first mode shifts to the second holding mode, the lid holder 23 moves upward in accordance with the lid guiding mechanism 81. This causes the lid holder 23 to lift up the substrates W without sliding with the substrates W. When the second holding mode shifts to the first holding mode, the lid holder 23 moves downward in accordance with the lid guiding mechanism 81. This causes the lid holder 23 to move the substrates W downward without sliding with the substrates W. Consequently, inhibited particle generation is obtainable between the substrates W and the lid holder 23 in any shift to the first and second holding modes.

The lid holder 23 moves upward/downward in response to attachment/detachment of the lid 3 to/from the casing 2. Accordingly, the holding mode of the substrates W is switchable at a timing of attaching/detaching the lid 3 to/from the casing 2.

Since the lid holder 23 moves upward in response to attachment of the lid 3 to the casing 2, the substrates W are held in the second holding mode in the condition where the lid 3 is attached to the casing 2. Moreover, since the lid holder 23 moves downward in response to detachment of the lid 3 from the casing 2, the substrates W are held in the first holding mode in the condition where the lid 3 is detached from the casing 2.

Movement of the lid 3 is transmitted to the lid holder 23 via the substrates W. In other words, the substrates W cause the movement of the lid 3 to be in response to the movement of the lid holder 23. This eliminates the lid lifting mechanism 65 of Embodiment 3, leading to a simplified configuration of the substrate container 1.

Since the lid holder 23 moves in accordance with the lid guiding mechanism 81, the lower position of the lid holder 23 is kept constant. For instance, horizontal deviation in lower position of the lid holder 23 is suitably avoidable every time the lid holder 23 moves upward/downward. Consequently, the substrates W on the rack 11 are disposed at a constant position every time the mode shifts to the first holding mode. In other words, deviation in position of the substrates W held in the first holding mode is avoidable.

The hole of the guiding member 83 is inclined relative to the forward/backward direction. Consequently, the guiding member 83 allows conversion of forward/backward movement of the lid 3 into upward/downward movement of the casing holder 16.

The direction where the casing guiding mechanism 81 guides the lid holder 23 includes the forward/backward component in addition to the upward/downward component. Accordingly, the lid holder 23 is movable in a direction where the lid holder 23 approaches or moves away from the casing holder 16. Consequently, the gap between the casing holder 16 and the lid holder 23 is able to conform to the external dimension of the substrates W.

When the substrates W are held in the second holding mode, the lid holder 23 presses the substrates W against the casing holder 16 by its own weight. Consequently, the gap between the casing holder 16 and the lid holder 23 is able to conform to the external dimension of the substrates W with ease. In addition, the casing holder 16 and the lid holder 23 are able to nip the substrate W by an suitable strength.

The present invention is not limited to the foregoing examples, but may be modified as follows.

(1) In the Embodiment 1 mentioned above, the casing holder 16 may move in the horizontal direction, and the casing lifting mechanism may include a casing elastic member. The casing elastic member elastically deforms in accordance with the horizontal movement of the casing holder 16 and applies a restoring force to the casing holder 16. The following describes two modifications with reference to drawings. Like numerals are used to identify like components which are the same as in Embodiment 1 and will not particularly be described.

Figure 15:
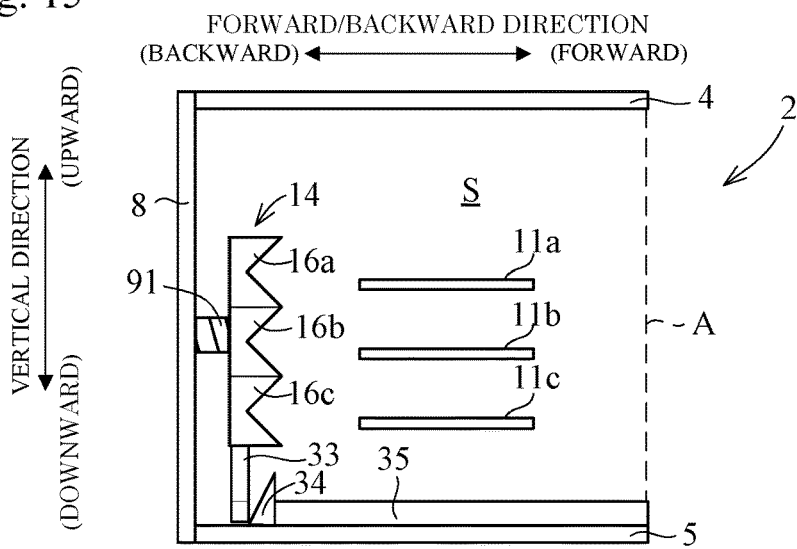
FIG. 15 is a side view with the left wall 7 not shown, illustrating an interior of a casing according to one modification of the present invention.

Reference is made to FIG. 15. The modification in FIG. 15 illustrates the casing lifting mechanism having a casing connecting board 33, a movable bases 34, rods 35, and a spring 91. The spring 91 is, for example, a compressive coil spring. The spring 91 is disposed between the casing 2 and the casing holder 16. The spring 91 has a first end connected to the casing 2, and a second end connected to the casing holder 16. When the casing holder 16 moves backward relative to the casing 2, the spring 91 compressively deforms to press the casing holder 16 forward.

Figure 16:
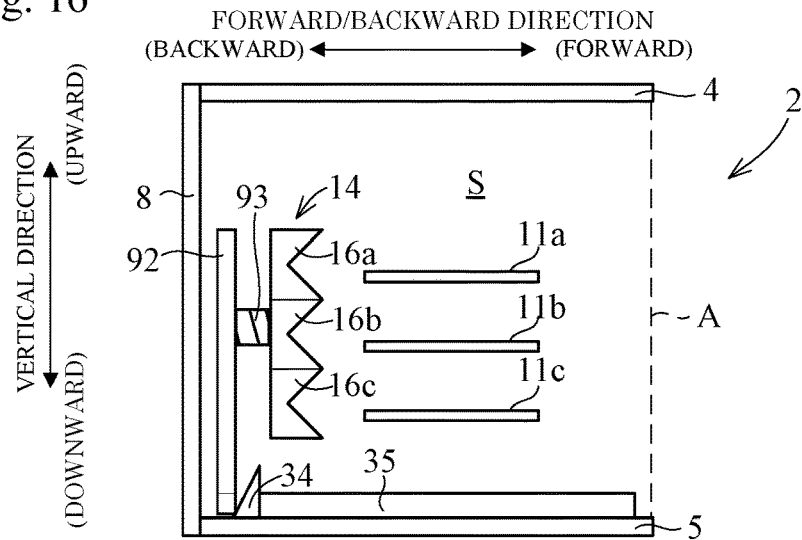
FIG. 16 is a side view with the left wall 7 not shown, illustrating an interior of the casing according to the modification.

Reference is made to FIG. 16. The modification in FIG. 16 illustrates the casing lifting mechanism having a movable bases 34, rods 35, a casing connecting board 92, and a spring 93. The casing connecting board 92 slidably contacts the movable bases 34 (slopes 34a). The spring 93 is disposed between the casing connecting board 92 and the casing holder 16. The spring 93 has a first end connected to the casing connecting board 92, and a second end connected to the casing holder 16. When the casing holder 16 moves backward relative to the casing connecting board 92, the spring 93 elastically deforms to press the casing holder 16 forward.

The springs 91 and 93 in the modifications mentioned above are each one example of the casing elastic member in the present invention.

In the above modifications, the casing lifting mechanism includes the spring 91 or the spring 93. Accordingly, the casing holder 16 and the lid holder 23 are able to hold the substrates W in the second holding mode.

(2) In Embodiment 1 and the modifications mentioned above, the substrate container 1 may further include a casing guiding mechanism that guides the casing holder 16. The following exemplarily describes two modifications.

Figure 17:
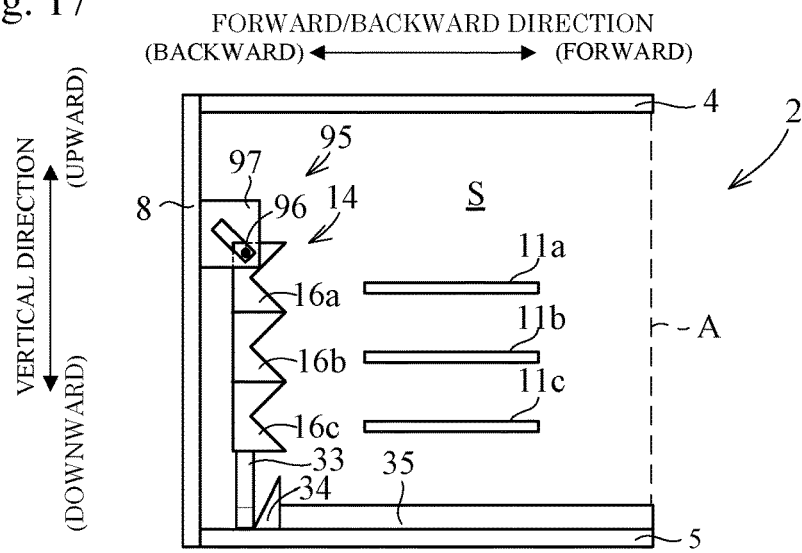
FIG. 17 is a side view with the left wall 7 not shown, illustrating an interior of a casing according to another modification of the present invention.

Reference is made to FIG. 17. The modification in FIG. 17 illustrates a substrate container 1 having a casing guiding mechanism 95. The casing guiding mechanism 95 includes a connecting pin 96 and a guiding member 97. The connecting pin 96 is fixed on the casing holder block 14 (casing holder 16). The guiding member 97 is fixed on the casing 2. The guiding member 97 has a hole into which the connecting pin 96 is inserted. The hole may extend in the upward/downward direction, or may extend so as to be inclined relative to the forward/backward direction. FIG. 17 illustrates a hole that is inclined so as to be higher in level toward backward. The connecting pin 96 slides relative to the guiding member 97, whereby the casing holder 16 moves in the upward/downward direction and the forward/backward direction relative to the casing 2.

With the present modification, the casing guiding mechanism 95 allows guidance of the casing holder 16 in a given direction.

Figure 18:
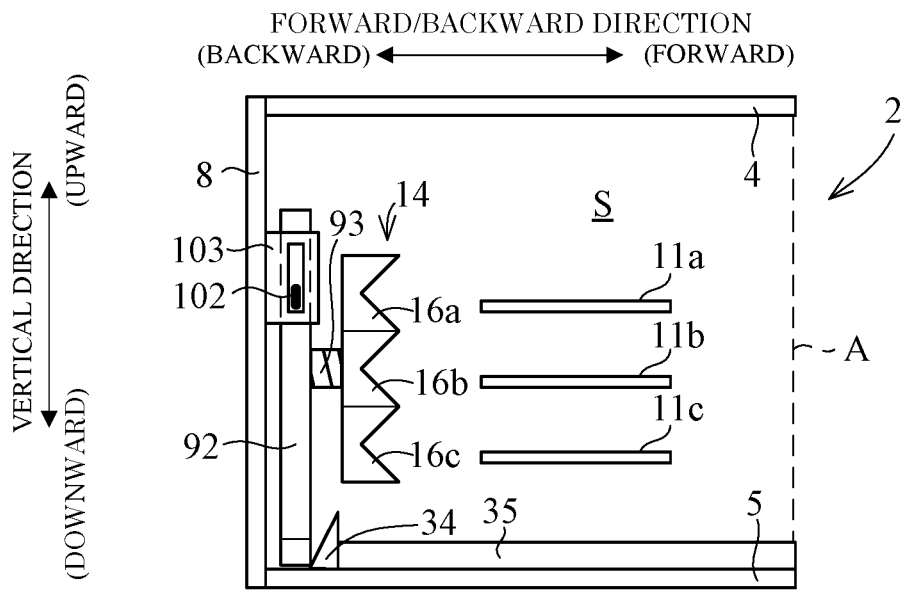
FIG. 18 is a side view with the left wall 7 not shown, illustrating an interior of the casing according to another modification.

Reference is made to FIG. 18. The modification in FIG. 18 illustrates a casing lifting mechanism having a movable bases 34, and rods 35, and also has the casing connecting board 92 and the spring 93 in FIG. 16. Moreover, the substrate container 1 includes a casing guiding mechanism. The casing guiding mechanism includes a connecting bar 102 and a guiding member 103. The connecting bar 102 is fixed on the casing connecting board 92. The guiding member 103 is fixed on the casing 2. The guiding member 103 has a hole into which the connecting bar 102 is inserted. The hole may extend in the upward/downward direction, or may extend so as to be inclined relative to the forward/backward direction. FIG. 18 illustrates a hole that extends in the upward/downward direction. The connecting bar 102 is inserted into the hole. The connecting bar 102 is movable in parallel along the hole, but is not rotatable around an axis of the connecting bar 102. The connecting bar 102 slides relative to the guiding member 103, whereby the casing connecting board 92 moves upward/downward relative to the casing 2. Such upward/downward movement of the casing connecting board 92 causes upward/downward movement of the casing holder 16 relative to the casing 2. In this manner, the casing guiding mechanism 101 guides the casing holder 16 via the casing connecting board 92.

(3) In Embodiment 1 mentioned above, the spring 32 is omittable. Such a present modification allows the casing lifting mechanism to move the casing holder 16 downward with use of gravity on the casing holder 16.

(4) In Embodiment 2 mentioned above, the substrate container 1 may include a casing elastic member.

Figure 19:
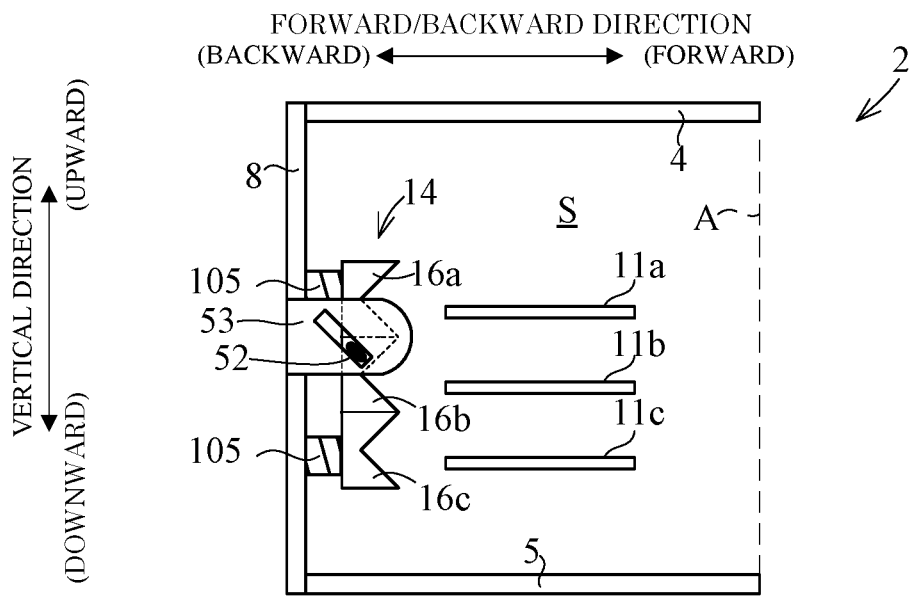
FIG. 19 is side view with the left wall 7 not shown, illustrating an interior of a casing according to another modification.

Reference is made to FIG. 19. The substrate container 1 includes a spring 105. The spring 105 is disposed between the casing 2 and the casing holder 16. The spring 105 has a first end connected to the casing 2, and a second end connected to the casing holder 16. When the casing holder 16 moves backward relative to the casing 2, the spring 105 compressively deforms to press the casing holder 16 forward. In other words, the spring 105 elastically deforms by movement of the casing holder 16 away from the lid holder 23 to press the casing holder 16 toward the lid holder 23. The spring 105 corresponds to one example of the casing elastic member in the present invention.

The substrate container 1 of this modification includes the spring 105. Accordingly, the casing holder 16 and the lid holder 23 are able to hold the substrates W suitably in the second holding mode.

(5) In Embodiment 3 mentioned above, the lid lifting mechanism 65 may include a lid elastic member. The lid elastic member is disposed between the lid 3 and the lid holder 23. Horizontal movement of the lid holder 23 relative to the lid 3 causes elastic deformation of the lid elastic member to apply a restoring force to the lid holder 23. The following exemplarily describes one modification.

Figure 20A:
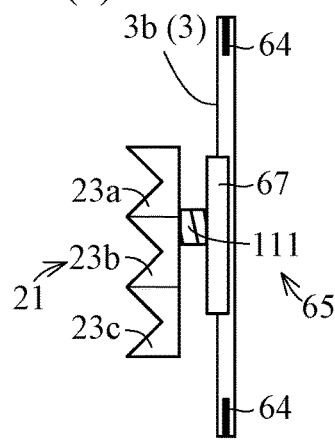
FIG. 20(a) is a side view of a lid according to another modification of the present invention in which a spring does not elastically deform.
Figure 20B:
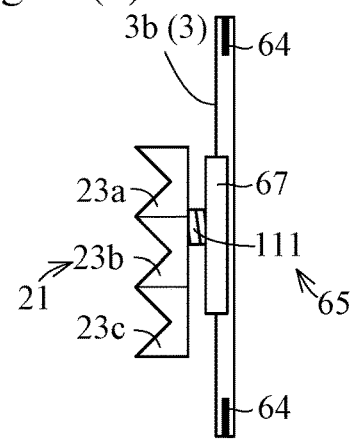
FIG. 20(b) is a side view of the lid according to the other modification in which a spring elastically deforms.

Reference is made to FIGS. 20(*a*) and 20(*b*). The lid lifting mechanism 65 includes a spring 111 in addition to a gear 66 and a rack 67. The spring 111 is disposed between the rack 67 and the lid holder 23. The spring 111 has a first end connected to the rack 67, and a second end connected to the spring 111. When the lid holder 23 approaches the rack 67 (lid 3), the spring 111 compressively deforms to press the lid holder 23 in a direction away from the rack 67 (lid 3). In other words, the spring 111 elastically deforms by movement of the casing holder 23 away from the lid holder 16 to press the casing holder 23 toward the lid holder 16. The spring 111 corresponds to one example of the casing elastic member in the present invention.

In the present modification, the lid lifting mechanism 65 includes the spring 111. Accordingly, the casing holder 16 and the lid holder 23 are able to hold the substrate W suitably in the second holding mode.

(6) In Embodiment 3 and the modification mentioned above, the substrate container 1 may further include a lid guiding mechanism that guides the lid holder 23. The following exemplarily describes one modification.

Figure 21A:
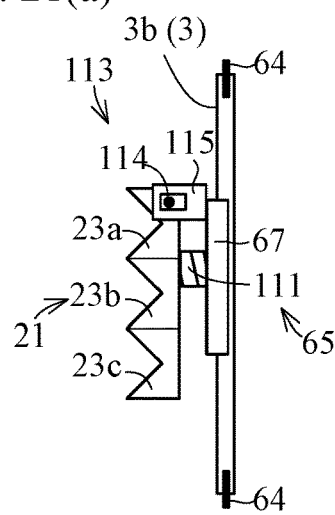
FIG. 21(a) is a side view of a lid according to another modification of the present invention in which a spring does not elastically deform.
Figure 21B:
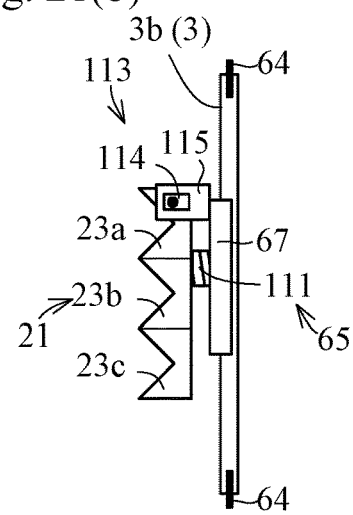
FIG. 21(b) is a side view of the lid according to the other modification in which a spring elastically deforms.

Reference is made to FIGS. 21(*a*) and 21(*b*). The lid lifting mechanism 65 includes the spring 111 in FIGS. 20(*a*) and 20(*b*) in addition to the gear 66 and the rack 67. Moreover, the substrate container 1 includes a lid guiding mechanism 113. The lid guiding mechanism 113 includes a connecting pin 114 and a guiding member 115. The connecting pin 113 is fixed on the lid holder block 21. The guiding member 115 is fixed on the rack 67. The guiding member 115 has a hole into which the connecting pin 114 is inserted. The hole extends in the forward/backward direction. The connecting pin 114 is inserted into the hole. The connecting pin 114 slides relative to the guiding member 115, whereby the lid holder 23 moves in the forward/backward direction relative to the rack 67 (lid 3). With the present modification, the lid guiding mechanism 113 allows guidance of the lid holder 23 in a given direction.

(7) In Embodiment 4 mentioned above, the spring 74 is omittable. In this case, the guiding member 79 preferably includes a hole that extends inclined relative to the forward/backward direction. Such a modification also allows the lid holder 23 to move in the forward/backward direction with use of gravity on the lid holder 23 and a pressing force on the lid holder 23 from the substrates W.

Moreover, in Embodiment 4 mentioned above, the lid guiding mechanism is omittable. Such a modification also allows the lid lifting mechanism to move the lid holder 23 upward/downward.

(8) In Embodiment 5 mentioned above, the substrate container 1 may further include a lid elastic member.

Figure 22A:
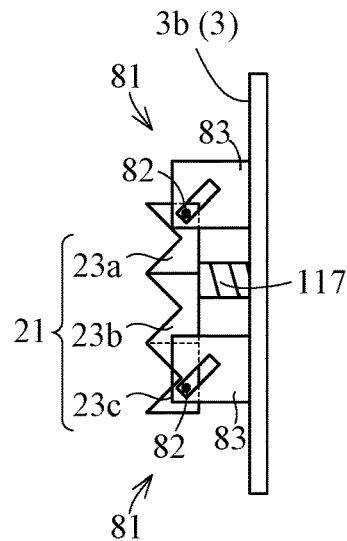
FIG. 22(a) is a side view of a lid according to another modification of the present invention in which a spring does not elastically deform.
Figure 22B:
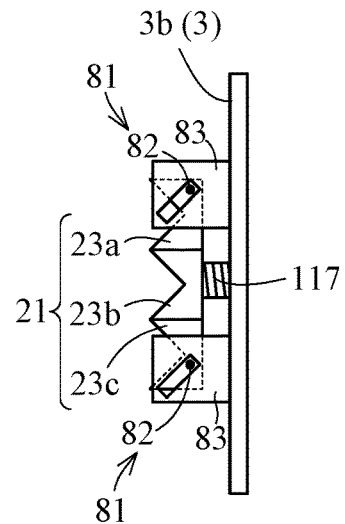
FIG. 22(b) is a side view of the lid according to the other modification in which a spring elastically deforms.

Reference is made to FIGS. 22(*a*) and 22(*b*). The substrate container 1 includes a spring 117. The spring 117 is disposed between the lid 3 and the lid holder 23. The spring 117 has a first end connected to the lid 3, and a second end connected to the lid holder 23. When the lid holder 23 approaches the lid 3, the spring 117 elastically deforms to press the lid holder 23 in a direction away from the lid 3. In other words, the spring 117 elastically deforms in accordance with movement of the lid holder 23 away from the casing holder 16 to press the lid holder 23 toward the casing holder 16. The spring 117 corresponds to one example of the lid elastic member in the present invention.

In the present modification, the substrate container 1 includes a spring 117. Accordingly, the casing holder 16 and the lid holder 23 achieve suitable holding of the substrates W in the second holding mode.

(9) The substrate container 1 may include either the casing lifting mechanism or the casing guiding mechanism in Embodiment 1 and 2, and any of the lid lifting mechanism mechanisms 65 and the lid guiding mechanism 81 in Embodiments 3 to 5.

Figure 23A:
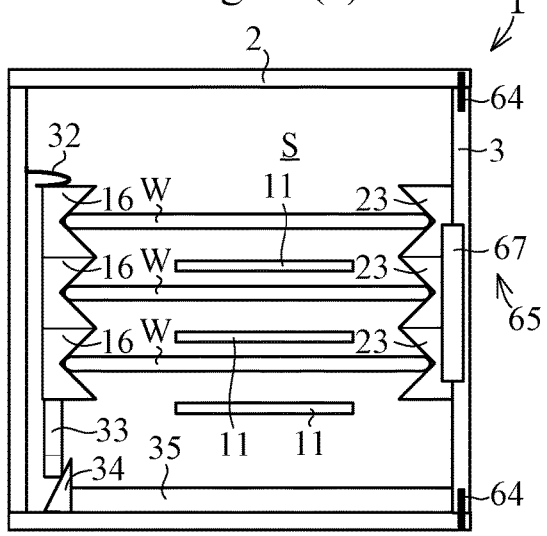
FIGS. 23(a) and 23(b) are each a side view with the left wall 7 not shown, illustrating an interior of a substrate container according to another modification of the present invention.
Figure 23B:
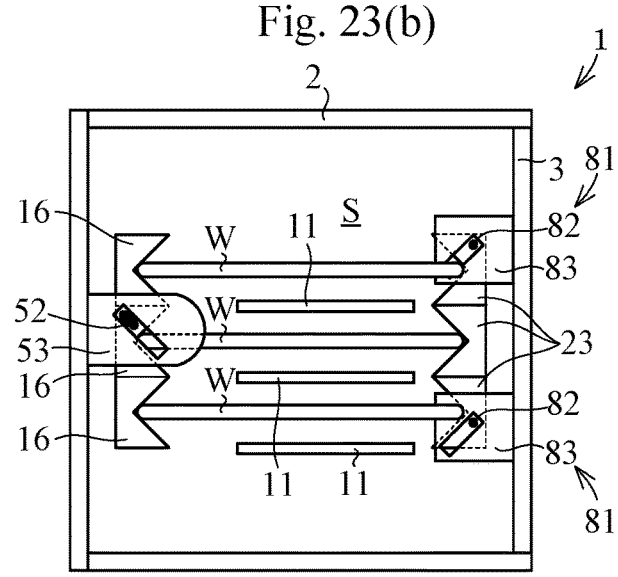

For instance, in one modification in FIG. 23(*a*), the substrate container 1 includes the casing lifting mechanism in Embodiment 1 and the lid lifting mechanism 65 in Embodiment 3. For instance, in one modification in FIG. 23(*b*), the substrate container 1 includes the casing guiding mechanism in Embodiment 2 and the lid guiding mechanism 81 in Embodiment 5. With these modifications, neither the casing holder 16 nor the lid holder 23 slides with the substrates W upon shifting to any of the first and second holding modes. This achieves inhibited particle generation effectively. Moreover, the substrates W are nipped in a horizontal attitude, leading to more stable accommodation of the substrates W.

(10) In the embodiments mentioned above, a plurality of casing holders 16 is formed integrally. However, this is not limitative. For instance, the casing holders 16 may be separated one another. The lid holder 23 is variable in configuration in the same manner as above.

(11) In the embodiments mentioned above, the casing holder 16 contacts the substrates W in the condition where the lid 3 is detached from the casing 2. However, this is not limitative. That is, the casing holder 16 need not contact the substrates W in the condition where the lid 3 is detached from the casing 2.

(12) In the embodiments mentioned above, the casing holder 16 and the lid holder 23 are variable in shape where appropriate. For instance, the downward slope 17*a* or the upward slope 17*c* may be omitted when the casing holder 16 contacts the substrates W only at the deepest parts 17*b*. Likewise, the downward slope 24*a* or the upward slope 24*c* may be omitted when the lid holder 23 contacts the substrates W only at the deepest parts 24*b*.

(13) In the embodiments mentioned above, a plurality of casing holders 16 is disposed in a row in the vertical direction. However, this is not limitative. That is, the casing holders 16 may be disposed in a plurality of rows in the vertical direction. Moreover, the casing holders 16 may be disposed in a staggered manner in the vertical direction. Such arrangement variation is similarly applicable to the lid holder 23.

(14) In the embodiments mentioned above, the substrate container 1 may further include a shield that shields the atmosphere within the casing 2. Alternatively, the substrate container 1 may further include a shield that keeps a space around the substrates W in the casing 2 clean.

For instance, the shield may shield the atmosphere between a space where the substrates W are held and a space where at least a part of the casing lifting mechanism is disposed. Alternatively, the shield may shield the atmosphere between a space where the substrates W are held and a space where at least a part of the casing guiding mechanism is disposed. The modifications achieve prevention of particles from entering into the space where the substrates W are held, the particles being generated in the casing lifting mechanism or the casing guiding mechanism. As a result, this causes suitable elimination of adhesion of the particles to the substrates W.

Figure 24:
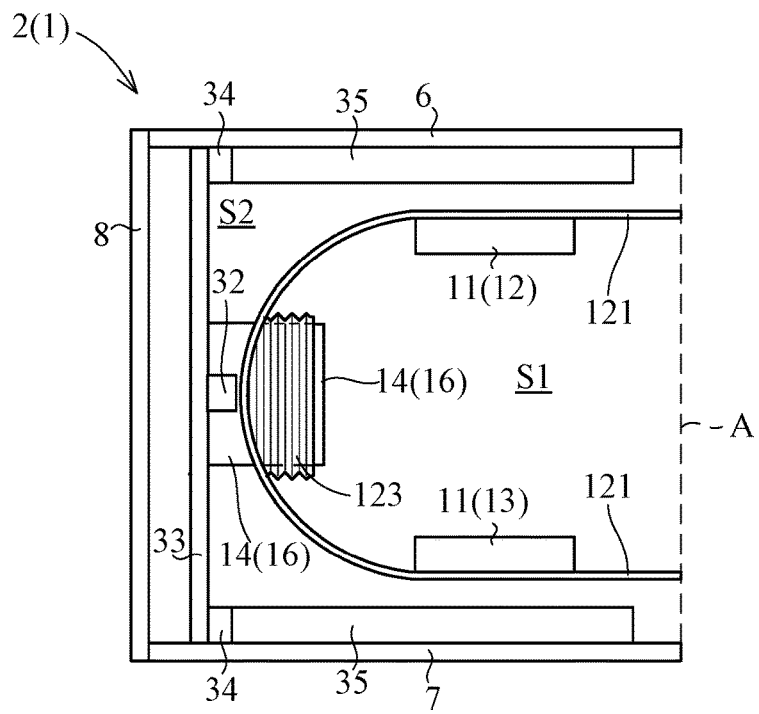
FIG. 24 is a plan view with the top plate 4 not shown, illustrating an interior of the casing according to another modification.

Reference is made to FIG. 24. The substrate container 1 includes a division wall 121 and a bellows 123 as the shield. The division wall 121 divides a space S1 where the substrate W is held from a space S2 where the casing lifting mechanism is disposed. The division wall 121 includes an opening into which the casing holder 16 is inserted. The casing holder 16 passes through the division wall 121. The bellows 123 is attached to the casing holder 16. The bellows 123 has a proximal end attached to the division wall 121. The bellows 123 allows expansion/contraction and/or bending following movement of the casing holder 16. The division wall 121 and the bellows 123 shield the atmosphere between the space S1 and the space S2.

The spring 32 and the guiding member 53 may be attached to the division wall 121 when the division wall 121 is fixed on the casing 2.

Alternatively, the shield may be attached to the lid 3. This achieves prevention of particles from entering into the space where the substrates W are held, the particles being generated in the lid lifting mechanism 65 or the lid guiding mechanism 81.

(15) In the embodiments mentioned above, the substrate container 1 may include a gas inlet for supplying gas into the casing 2 and a gas outlet for exhausting gas within the casing 2. The gas inlet and the gas outlet are preferably disposed such that gas flows backward from the substrates W to the casing lifting mechanism or the casing guiding mechanism. For instance, the gas inlet may be disposed forward of the gas outlet. Moreover, the gas inlet may be disposed below the gas outlet. This allows exhaust of particles outside the casing 2 without passing the space where the substrates W are held, the particles being generated in the casing lifting mechanism or the casing guiding mechanism.

Figure 25:
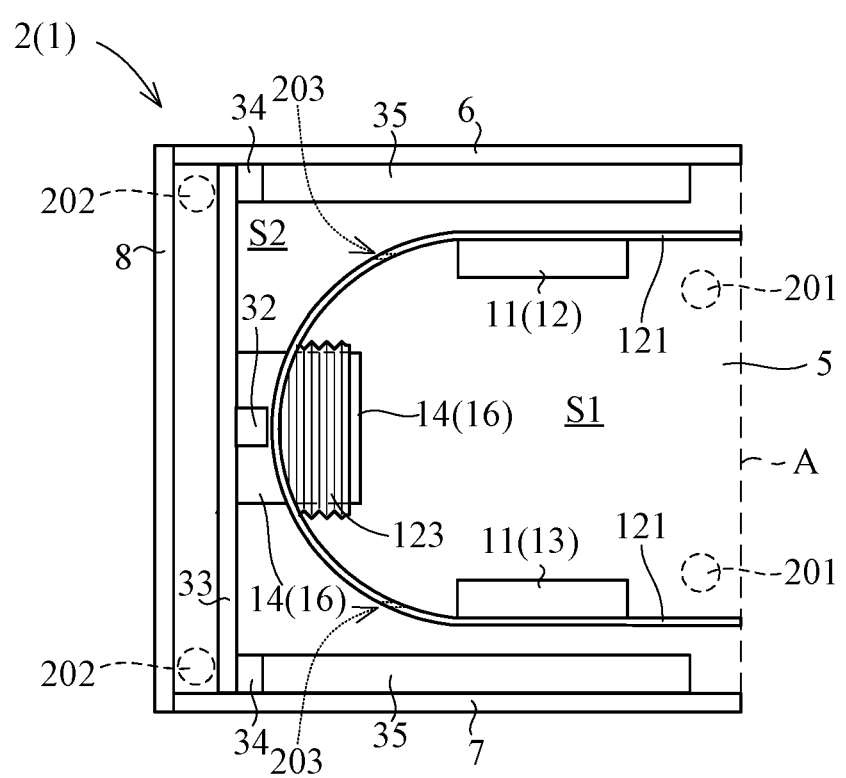
FIG. 25 is a plan view with the top plate 4 not shown, illustrating the interior of the casing according to another modification.

FIG. 25 is a plan view of the substrate container 1 in the modification mentioned above. A plurality of gas inlets 201 in communication with the space S1 is formed at a position of the bottom plate 5 adjacent to the opening A. The gas inlets 201 are connected to a gas supply port (not shown). The gas supply port is connectable to an external device that supplies gas. A plurality of gas outlets 202 in communication with the space S2 is formed at a position of the bottom plate 5 adjacent to the rear wall 8. The gas outlets 202 has a gas exhaust port (not shown) arranged therein. The gas exhaust port is connectable to an external device that exhausts gas. Moreover, a plurality of communication holes 203 is formed at a rearward portion of the division wall 121 so as to be aligned in the upward/downward direction. The space S1 and the space S2 are in communication with each other through these communication holes 203.

When the substrate container 1 is placed on the mount table 44, the gas supply port is connected to the external device, and the gas exhaust port is connected to the external device. The external device supplies gas, such as inert gas, to the substrate container 1 through the gas supply port, and exhausts gas from the substrate container 1 through the gas exhaust port. The gas supplied into the substrate container 1 flows through the gas inlets 201 into the space S1. The gas within the space S2 is exhausted externally of the substrate container 1 through the gas outlets 202. This forms airflows within the casing 2 that runs from the space S1 to the space S2 through the communication holes 203. The airflows are directed substantially backward. Consequently, gas within the space S1 is exhausted toward the space S2. Here, gas within the space S2 is prevented from entering into the space S1.

(16) In Embodiments 4 and 5 mentioned above, the guiding members 79 and 83 are separated from the lid 3. However, this is not limitative. That is, the lid 3 may be formed integrally with the guiding members 79 and 83. For instance, a groove for sliding the connecting pins 78 and 82 may be formed in the lid 3. For instance, the groove may be formed inside the lid 3 (specifically, a position bowed inward from the rear face 3b of the lid 3). Moreover, a recess into which at least a part of the lid holder 23 is accommodated may be formed on the rear face 3b of the lid 3. Such modifications obtain the entirely-thinned lid 3 and lid holder 23.

(17) In the embodiments mentioned above, the load port devices 420, 421, and 422 each include one mount table 44. However, this is not limitative. That is, modification is applicable to the load port apparatus with a plurality of mount tables. Moreover, in the embodiments mentioned above, one substrate container 1 is placed on each of the load port devices 420, 421, and 422. However, this is not limitative. That is, modification is applicable to place a plurality of substrate containers 1 on the load port device.

(18) Embodiments 1 to 5 and the modifications in the above (1) to (17) are variable appropriately by replacing or combining the unit of the present embodiments or the modifications with the other thereof.

REFERENCE SIGNS LIST

1 . . . substrate container
2 . . . casing
3 . . . lid
3b . . . rear face
11a, 11b, 11c, 11 . . . rack
16a, 16b, 16c, 16 . . . casing holder
23a, 23b, 23c, 23 . . . lid holder
34 . . . movable base
34a . . . slope
41 . . . substrate treating apparatus
42 . . . load port section
44 . . . mount table
45 . . . lid open/close mechanism
47 . . . transport mechanism
48 . . . treating unit
95 . . . casing guiding mechanism
65 . . . lid lifting mechanism
73 . . . fixed base
74, 111, 117 . . . spring (lid elastic member)
73 . . . slope
81, 113 . . . lid guiding mechanism
91, 93, 105 . . . spring (casing elastic member)
420, 421, 422 . . . load port device
A . . . opening
W . . . substrate

The invention claimed is:
1. A substrate container, comprising:
a casing with an opening on its front face and configured for accommodating substrates therein;
a plurality of racks inside the casing configured for holding respective substrates while contacting undersurfaces of the substrates in a horizontal attitude;
a casing holder block within the casing comprising casing holders configured for holding respective rear ends of the substrates;
a lid that is attached/detached to/from the casing and opens/closes the opening;
a lid holder block that is attached to a rear face of the lid movably upward/downward relative to the lid and comprising lid holders that are configured for holding respective front ends of the substrates; and
a lid lifting mechanism that is configured to move the lid holder block upward/downward relative to the lid, wherein
the casing holder block and the lid holder block are configured to nip the respective rear and front ends of the substrates while the racks do not contact the undersurfaces of the substrates,
for shifting between substrate holding with the racks and substrate holding with the casing holder block and the lid holder block, the lid lifting mechanism moves the lid holder block upward, whereby the lid holder block is operable for moving accommodated substrates upward,
for shifting between the substrate holding with the casing holder block and the lid holder block and the substrate holding with the racks, the lid lifting mechanism moves the lid holder block downward, whereby the lid holder block is operable for moving accommodated substrates downward, and
the lid lifter moves the lid holder block upward/downward relative to the casing in response to locking/unlocking of the lid to/from the casing.

2. The substrate container according to claim 1, further comprising:
a locking mechanism comprising a coupling member in the lid which is configured to mate with a corresponding recess in the casing to lock the lid to the casing,
wherein the lid lifting mechanism is interlocked to the locking mechanism and moves the lid holder block upward/downward in response to operation of the locking mechanism.

3. The substrate container according to claim 1, wherein the lid lifting mechanism comprises a lid elastic member that is configured to deform elastically in accordance with approach of the lid holder block to the lid and applies a restoring force to the lid holder block.

4. The substrate container according to claim 1, further comprising:
a lid guiding mechanism that is configured to guide the lid holder block, wherein the lid guiding mechanism comprises:
a connecting pin fixed on the lid holder block, and
a guiding member fixed on the lid and having a hole into which the connecting pin is inserted.

5. A substrate container, comprising:
a casing with an opening on its front face and configured for accommodating substrates therein;
a plurality of racks inside the casing configured for holding respective substrates while contacting undersurfaces of the substrates in a horizontal attitude;
a casing holder block within the casing comprising casing holders configured for holding respective rear ends of the substrates;
a lid that is attached/detached to/from the casing and opens/closes the opening;
a lid holder block that is attached to a rear face of the lid movably upward/downward relative to the lid and comprising lid holders that are configured for holding respective front ends of the substrates; and a lid lifting mechanism that is configured to move the lid holder block upward/downward relative to the lid, wherein the casing holder block and the lid holder block are configured to nip the respective rear and front ends of the substrates while the racks do not contact the undersurfaces of the substrates, when substrate holding with the racks shifts to substrate holding with the casing holder block and the lid holder block, the lid lifting mechanism moves the lid holder block upward, whereby the lid holder block is operable for moving accommodated substrates upward, when the substrate holding with the casing holder block and the lid holder block shifts to the substrate holding with the racks, the lid lifting mechanism moves the lid holder block downward, whereby the lid holder moves the block is operable for moving accommodated substrates downward, and the substrate container further comprising:

a lid guiding mechanism that is configured to guide the lid holder block, wherein the lid guiding mechanism comprises:
   a connecting pin fixed on the lid holder block, and
   a guiding member fixed on the lid and having a hole into which the connecting pin is inserted.

* * * * *